United States Patent [19]
Korsh et al.

[11] Patent Number: 5,901,089
[45] Date of Patent: May 4, 1999

[54] STABILIZATION CIRCUITS AND TECHNIQUES FOR STORAGE AND RETRIEVAL OF SINGLE OR MULTIPLE DIGITAL BITS PER MEMORY CELL

[75] Inventors: George J. Korsh, Redwood City; Sakhawat M. Khan, Sunnyvale, both of Calif.

[73] Assignee: Agate Semiconductor, Inc., Sunnyvale, Calif.

[21] Appl. No.: 09/054,370

[22] Filed: Apr. 2, 1998

Related U.S. Application Data

[63] Continuation of application No. 08/640,367, Apr. 30, 1996, Pat. No. 5,815,439.

[51] Int. Cl.$^6$ ..................................................... G11C 7/00
[52] U.S. Cl. ............................... 365/185.24; 365/185.03; 365/185.19
[58] Field of Search .................. 365/185.24, 185.19, 365/185.28, 185.29, 185.03, 45

[56] References Cited

U.S. PATENT DOCUMENTS

| | | | |
|---|---|---|---|
| 4,890,259 | 12/1989 | Simko | 365/45 |
| 4,989,179 | 1/1991 | Simko | 365/45 |
| 5,043,940 | 8/1991 | Harari | 365/168 |
| 5,172,338 | 12/1992 | Mehrotra | 365/185.03 |
| 5,218,569 | 6/1993 | Banks | 365/189 |
| 5,258,759 | 11/1993 | Cauwenberghs et al. | 341/150 |
| 5,268,870 | 12/1993 | Harari | 365/218 |
| 5,293,560 | 3/1994 | Harari | 365/185 |
| 5,365,486 | 11/1994 | Schreck | 365/222 |
| 5,394,362 | 2/1995 | Banks | 365/189 |
| 5,422,842 | 6/1995 | Cernea et al. | 365/185 |
| 5,479,170 | 12/1995 | Cauwenberghs et al. | 341/200 |
| 5,511,020 | 4/1996 | Hu et al. | 365/185.28 |
| 5,539,690 | 7/1996 | Talreja et al. | 365/185.22 |
| 5,657,332 | 8/1997 | Auclair et al. | 371/40.11 |

OTHER PUBLICATIONS

Bauer et al., "A Mutilevel–Cell 32Mb Flash Memory," *1995 IEEE ISSCC*, Feb. 16, 1995, pp. 132–133 & 351.

Atsumi et al., "A 16–Mb Flash EEPROM with a New Self–Data–Refresh Scheme for a Sector Erase Operation," *IEEE J. Solid–State Circuits* (1995) 29:461–469.

Shirota et al., "A new Programming Method and Cell Architecture and for Multi–Level Nand Flash Memories," *The 14th Annual IEEE Nonvolatile Semiconductor Memory Workshop*, Aug. 1995, pp. 2.7.

Jung et al., "A 3.3V 128Mb Multi–Level Nand Flash Memory for Mass Storage Applications," *1996 IEEE ISSCC*, Feb. 8, 1996, pp. 32–33 & 412.

Ohkawa et al., "A 98mm 3.3V 64Mb Flash Memory wiht FN–NOR Type 4–level Cell, " *1996 IEEE ISSCC*, Feb. 8, 1996, pp. 36–37 & 413.

(List continued on next page.)

*Primary Examiner*—Vu A. Le
*Attorney, Agent, or Firm*—Townsend and Townsend and Crew LLP

[57] ABSTRACT

An integrated circuit memory system having memory cells capable of storing multiple bits per memory cell is described. The memory system has a restoring operation in which a memory cells' stored charge, which may drift from its initially set condition, is maintained within one of a plurality of predetermined levels corresponding to digital bits of information and defined by a set of special reference voltage values. The memory system has mini-programming and mini-erasing operations to move only the amount of charge into and out of the memory cell sufficient to keep the charge within the predetermined levels. The memory system also has an operation for high speed programming of the memory cells and an erasing operation to narrow the charge distribution of erased memory cells for increasing the spread, and safety margins, between the predetermined levels.

38 Claims, 18 Drawing Sheets

OTHER PUBLICATIONS

Horiguchi et al., "An Experimental Large–Capacity Semiconductor File Memory using 16–Levels/Cells Storage," *IEEE J. Solid–State Circuits* (1988) 23:27–33.

Bergemont et al., "NOR Virtual Ground (NVG)—A New Scaling Concept for Very High Density Flash EEPROM and its Implementation in a 0.5um Process," *IEDM*, Dec. 3–8, 1993, pp. 15–18.

Kim et al., "A Novel Dual String NOR (DuSNOR) Memory Cell Technology Scalable to the 256 Mbit and 6 Gbit Flash Memories," *IEDM*, Dec. 10–13, 1995, pp. 263–266.

Yamauchi et al., "A New Cell Stucture for Sub–quarter Micron High Density Flash Memory," *IEDM*, Dec. 10–13, 1995, pp. 267–270.

Kirisawa et al., "A NAND Structured Cell with a New Programming Technology for Highly Reliable 5V–only Flash EEPROM," *1990 Symposium on VLSI Technology*, Jun. 4–7, 1990, pp. 129–130.

Kobayashi et al., "Memory Array Architecture and Decoding Scheme for 3 V Only Sector Erasable Dinor Flash Memory," *IEEE J. Solid–State Circuits* (1994) 29:454–460.

Kato et al., "Read–Disturb Degradation Mechanism Mechanism due to Electron Trapping in the Tunnel Oxide for Low–Voltage Flash Memories," *IEDM*, Dec. 11–14, 1994, pp. 45–48.

Onoda et al., "A Novel Cell Structure Suitable for a 3 Volt Operation, Sector Erase Flash Memory," *IEDM*, Dec. 13–16, 1992, pp. 599–602.

Baglee et al., "The Effects of Write/Erase Cycling on Data Loss in EEPROMs," *IEDM*, Dec. 1–4, 1985, pp. 624–626.

Peng et al., "Flash EPROM Endurance Simulation Using Physics–Based Models," *IEDM*, Dec. 11–14, 1994, pp. 295–298.

Verma et al., "Reliabiltiy Performance of ETOX Based Flash Memories," *1988 IEEE International Reliability Physics Symposium*, Apr. 11–13, 1988, pp. 158–166.

Ong et al., "Erratic Erase in ETOX Flash Memory Array," *1993 VLSI Symposium on Technology*, May 17–19, 1993, pp. 83–84.

Cappelletti et al., "Failure Mechanisms of Flash Cell in Program/Erase Cycling," *IEDM*, Dec. 11–14, 1994, pp. 291–294.

Naruke et al., "Stress Induced Leakage Current Limiting to Scale Down EEPROM Tunnel Oxide Thickness," *IEDM*, Dec. 11–14, 1988, pp. 424–427.

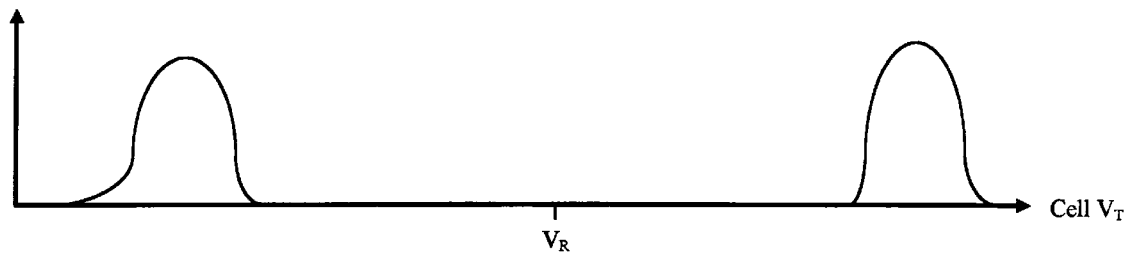
Prior Art
FIG._1A.
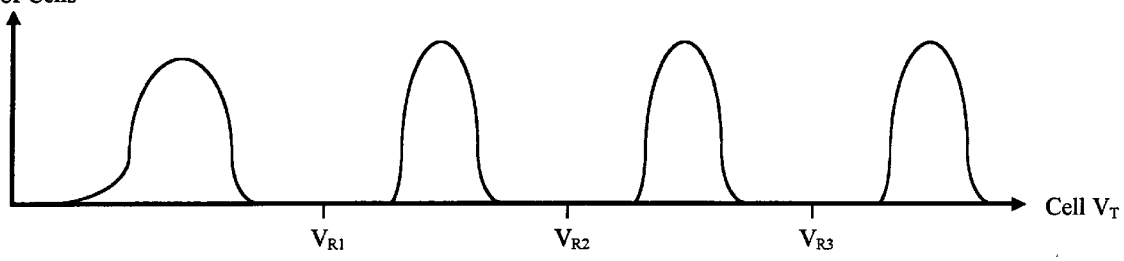
Prior Art
FIG._1B.
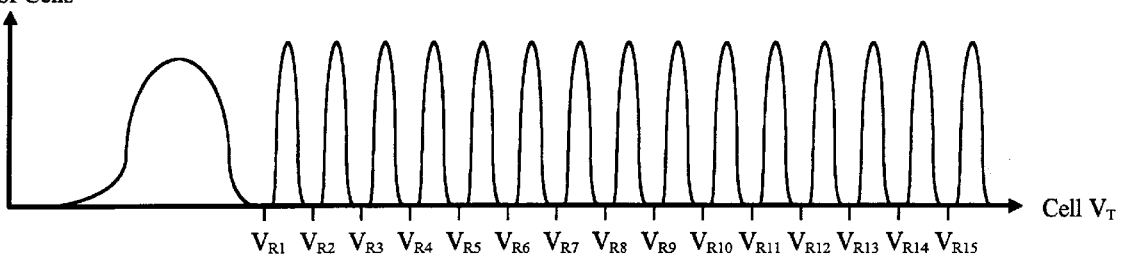
FIG._1C.

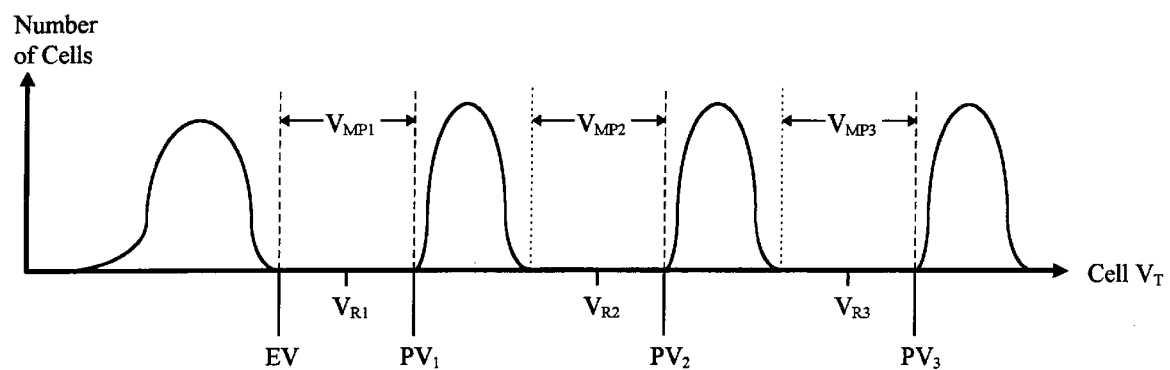
Prior Art
FIG._2.

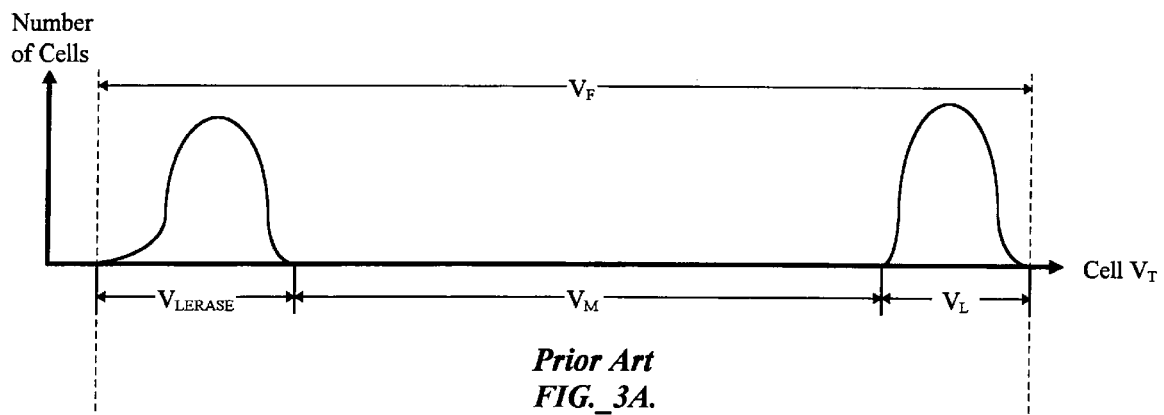
Prior Art
*FIG._3A.*
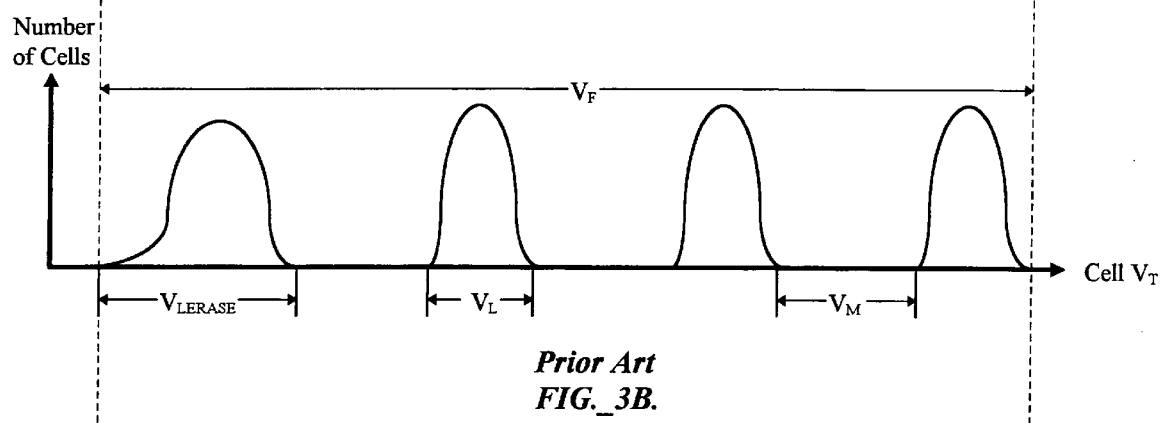
Prior Art
*FIG._3B.*
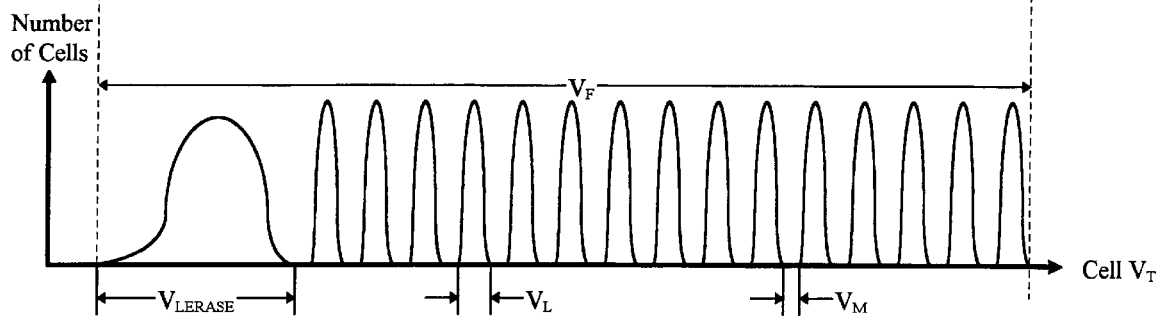
*FIG._3C.*

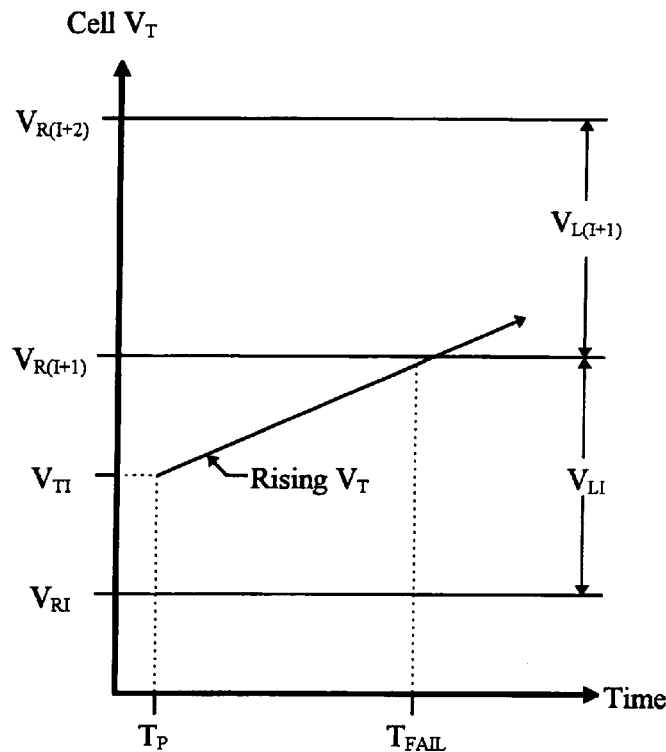
FIG._4A.
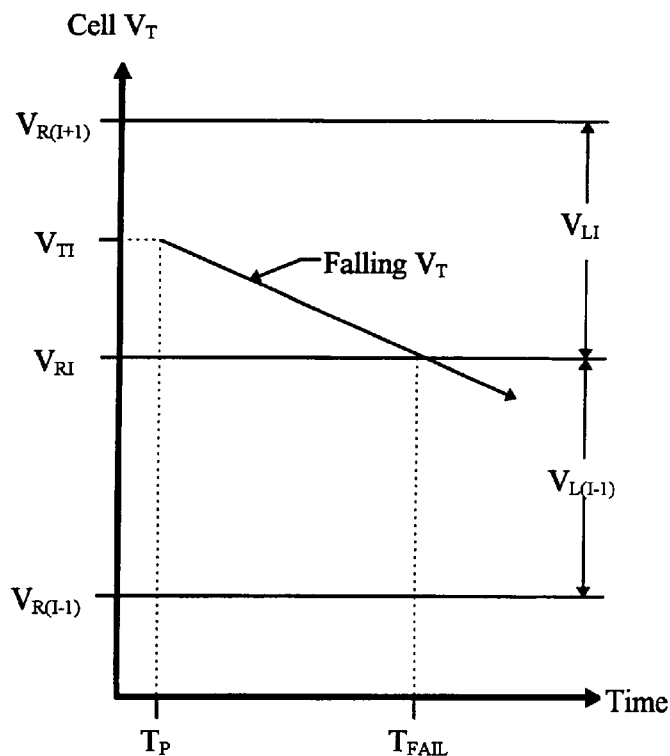
FIG._4B.

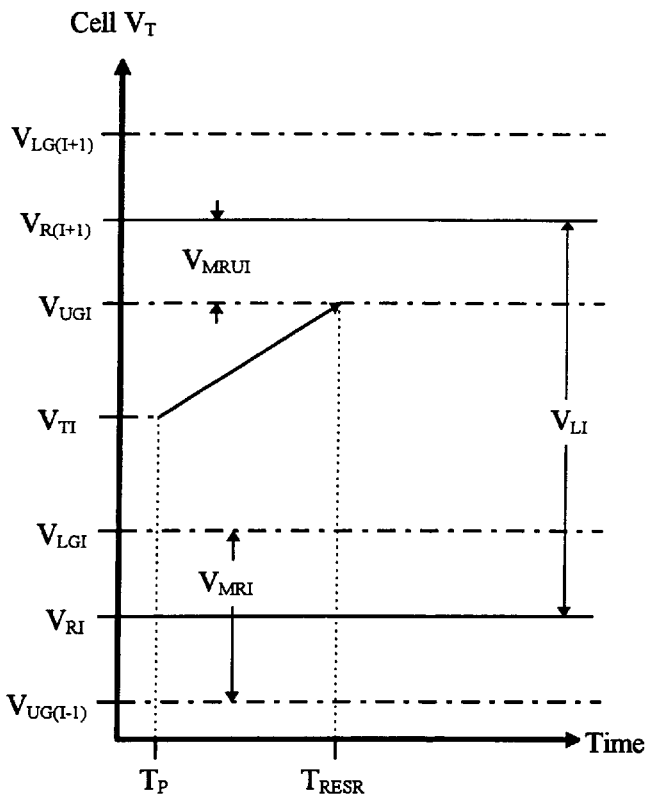
FIG._5A.
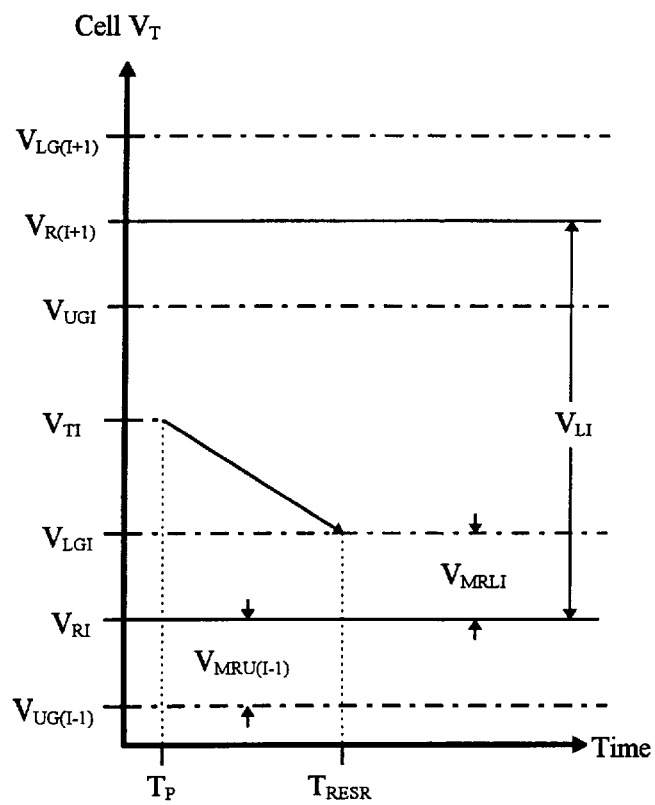
FIG._5B.

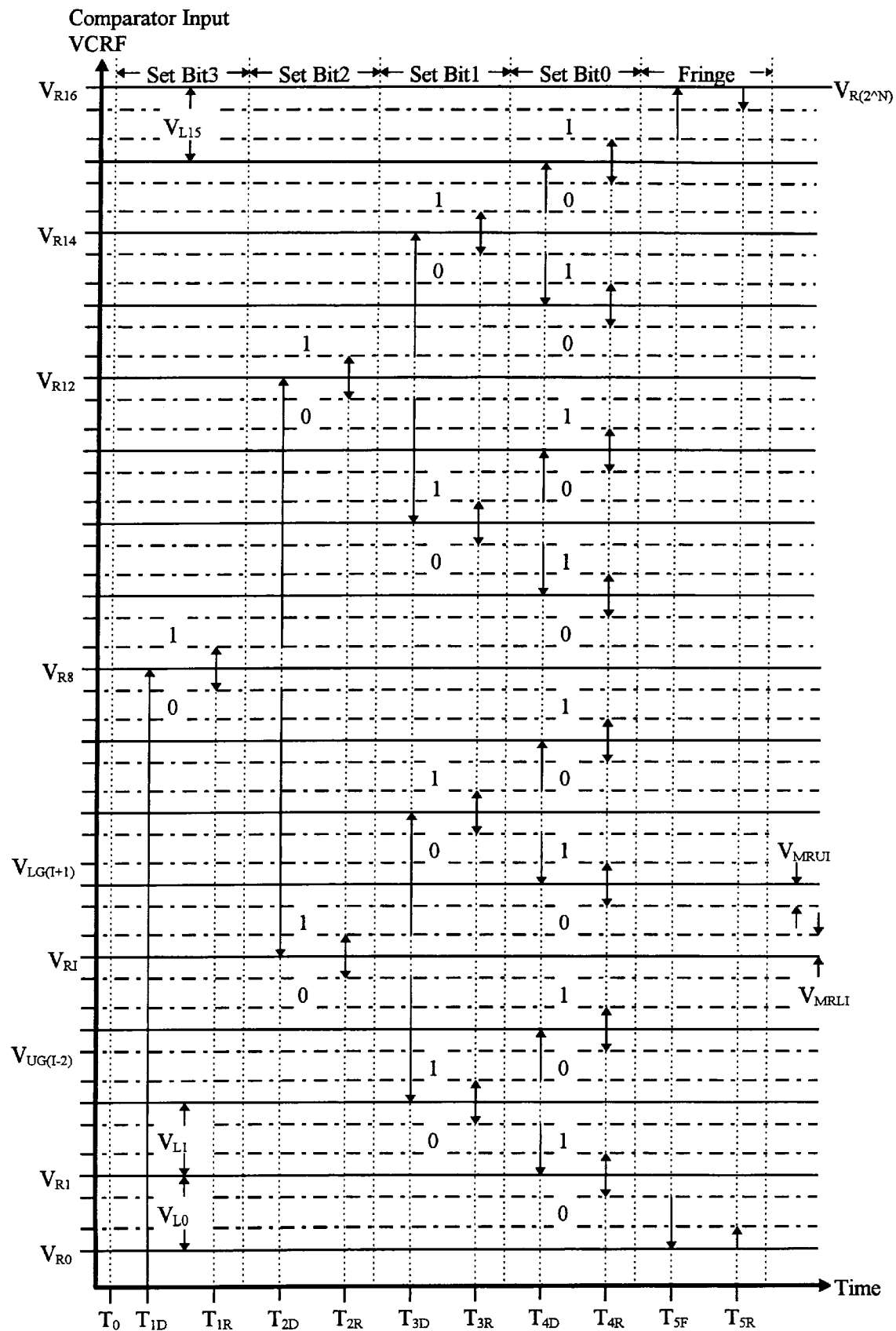
FIG._6.

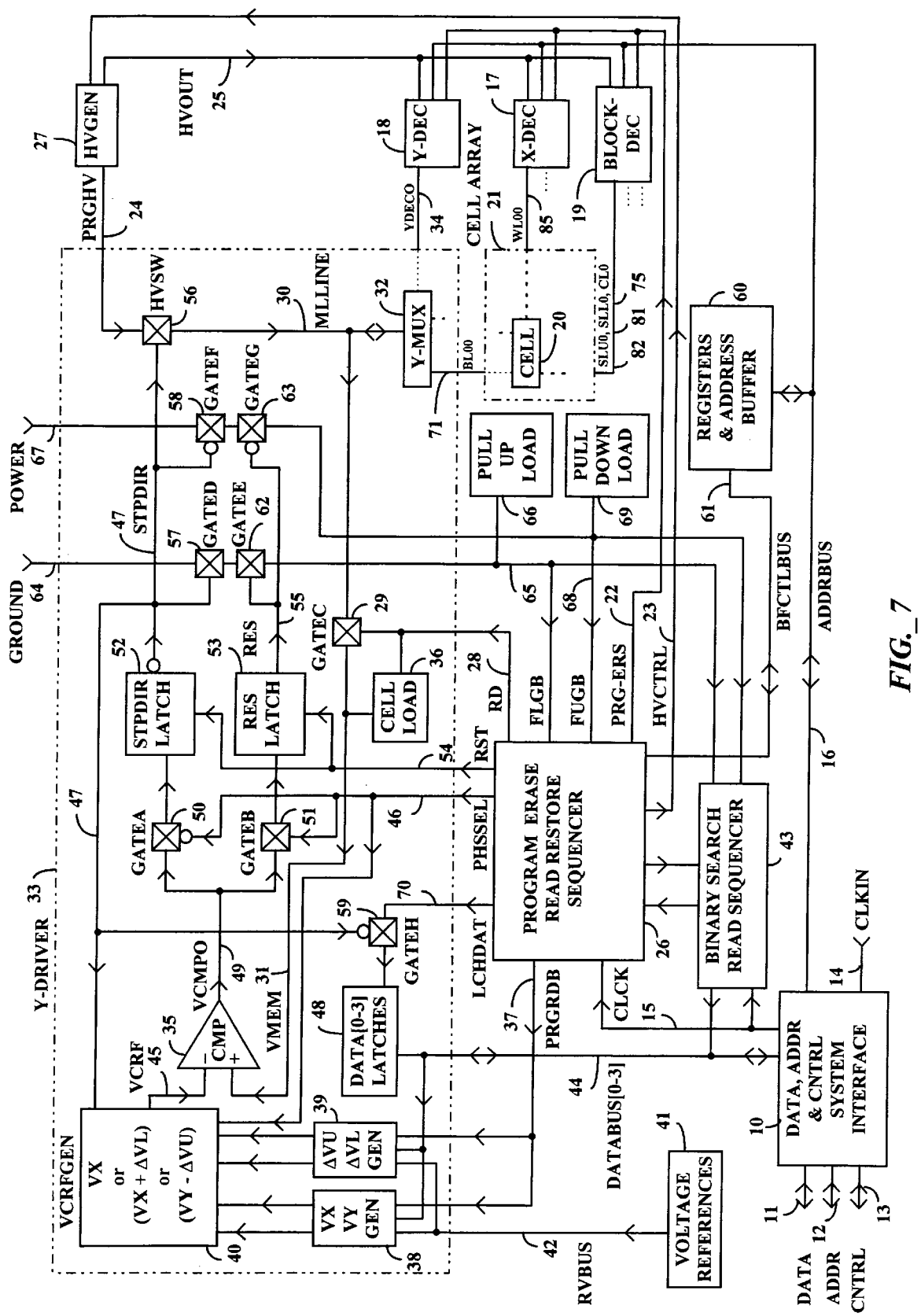
FIG._7

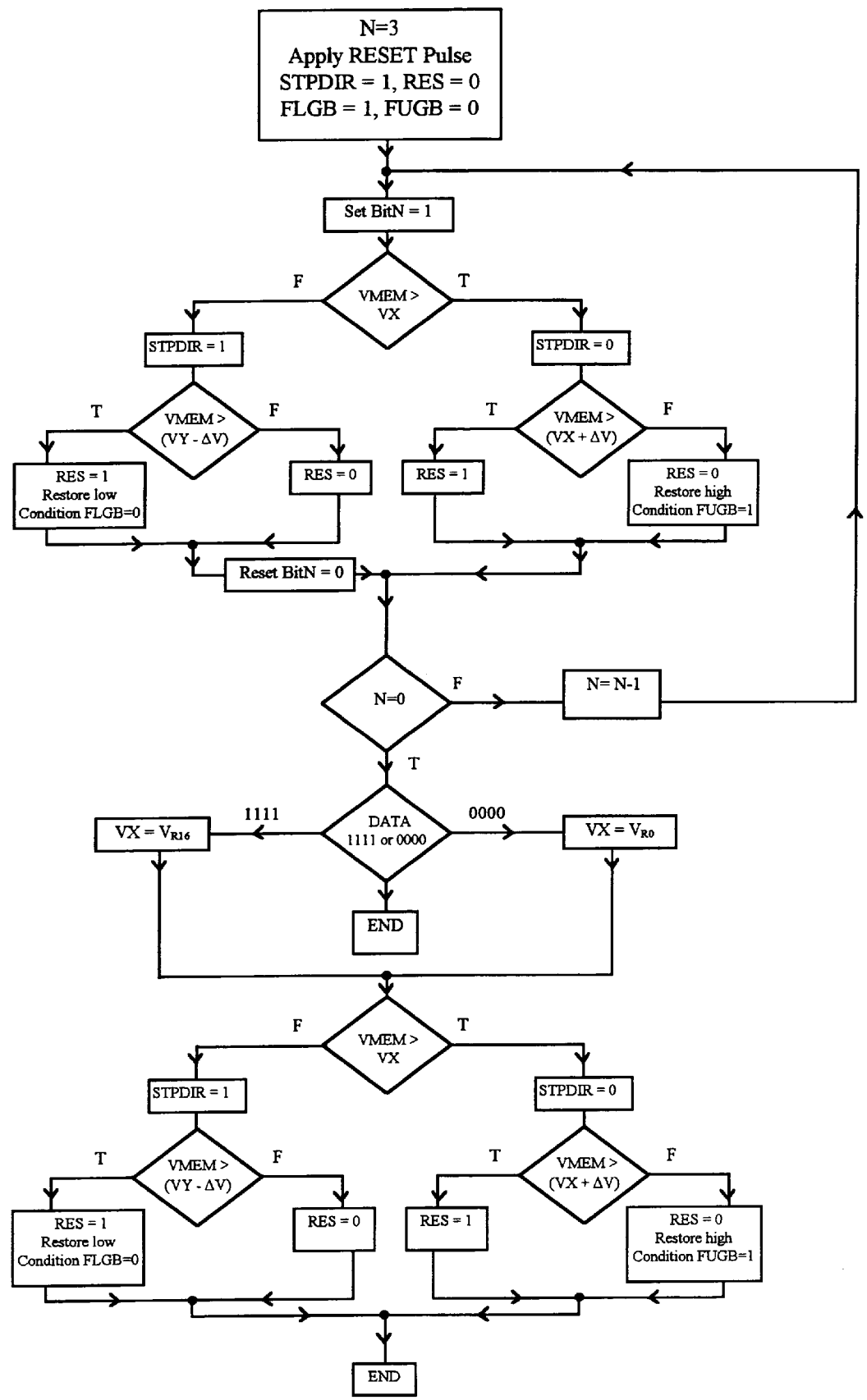
FIG._8

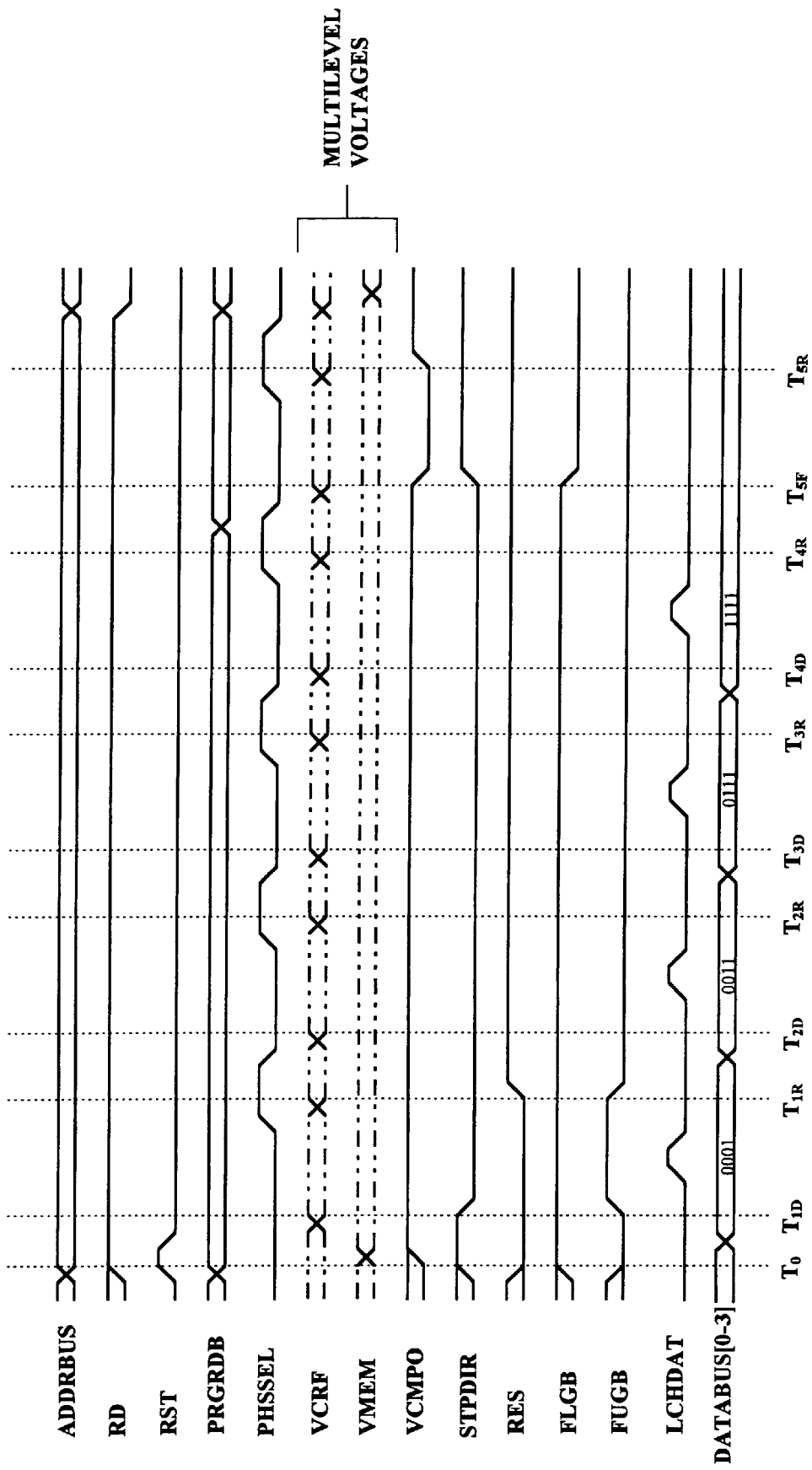
FIG_10

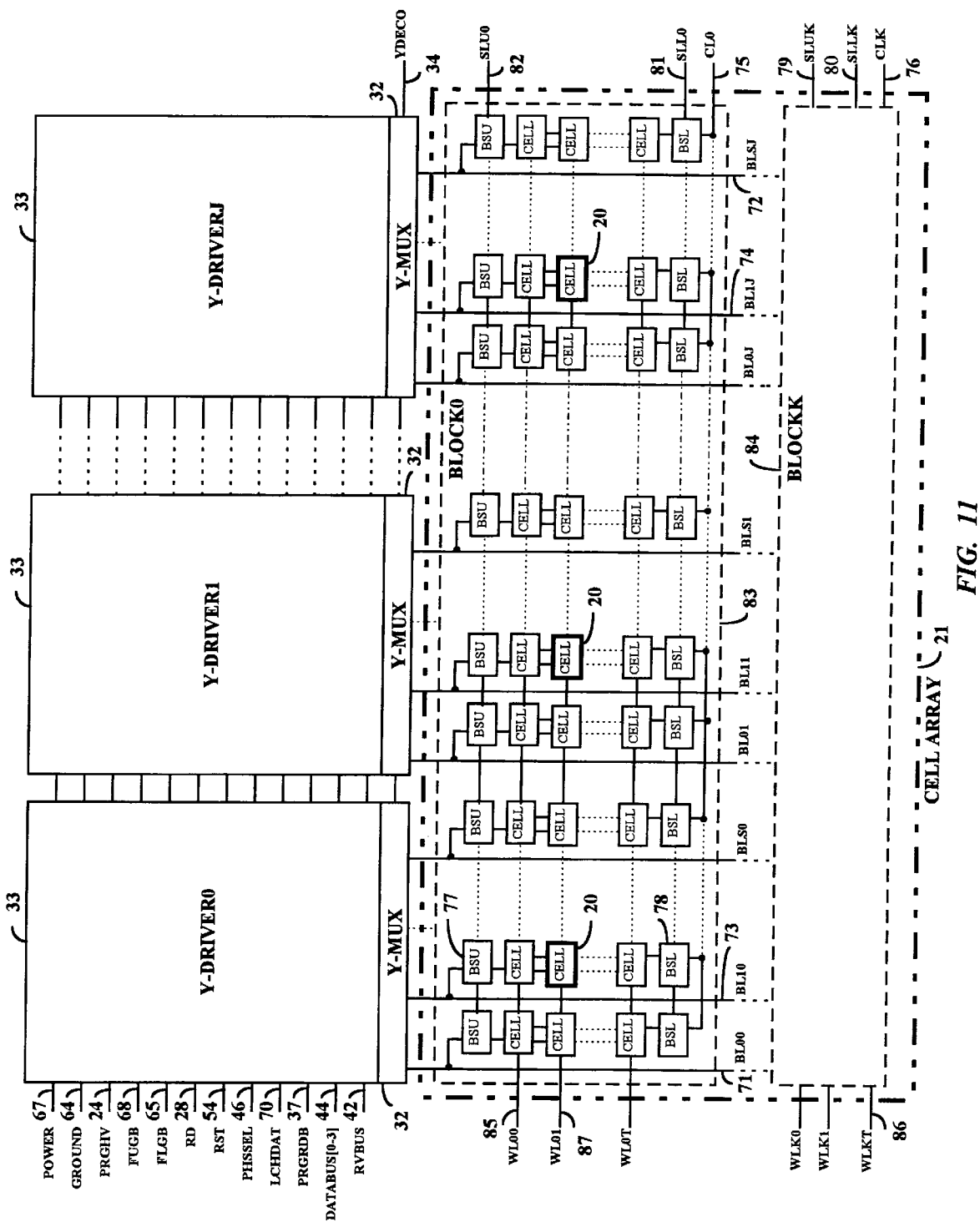
FIG._11

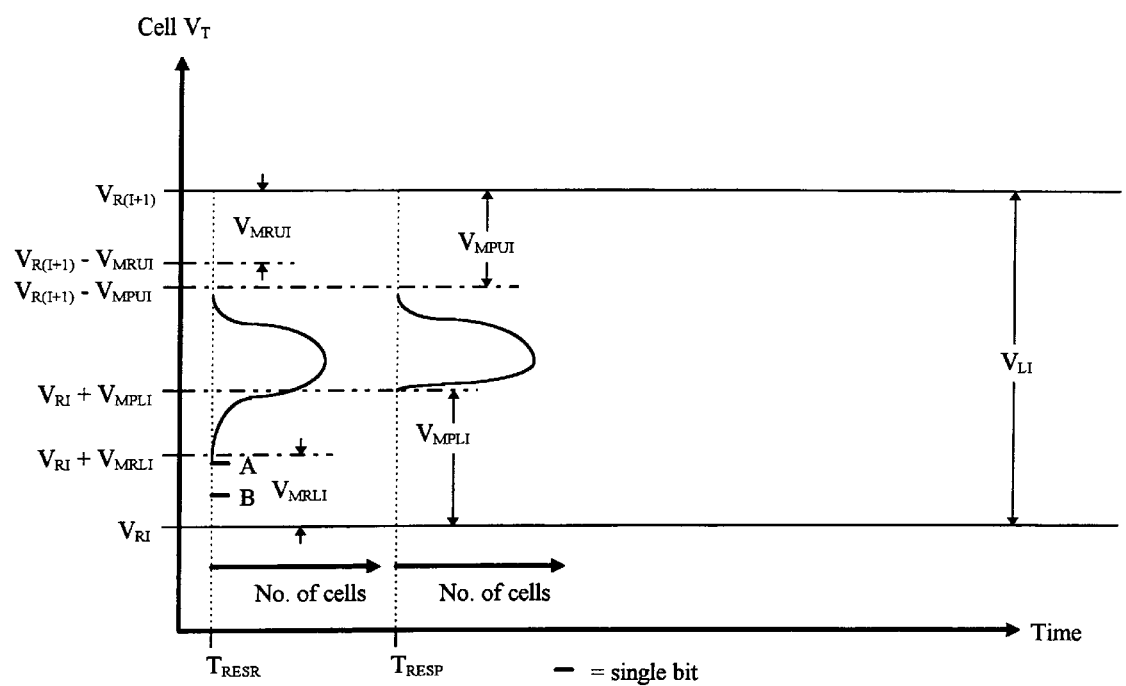
FIG._12.

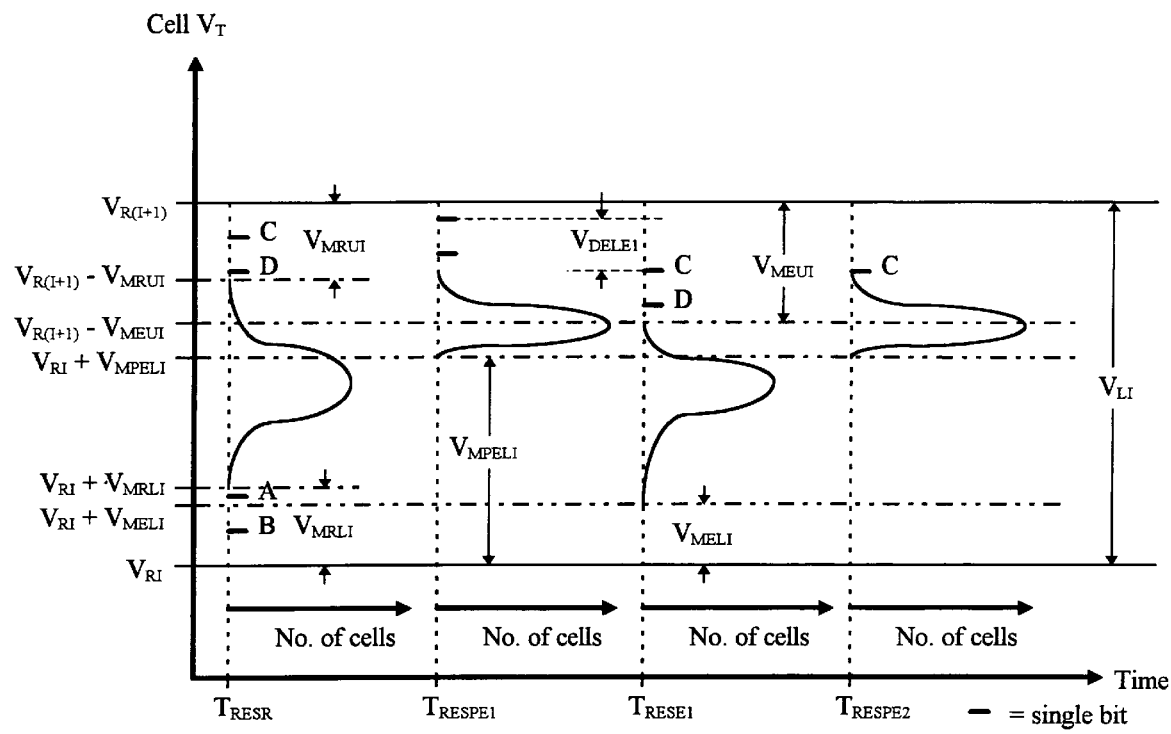
FIG._13A.
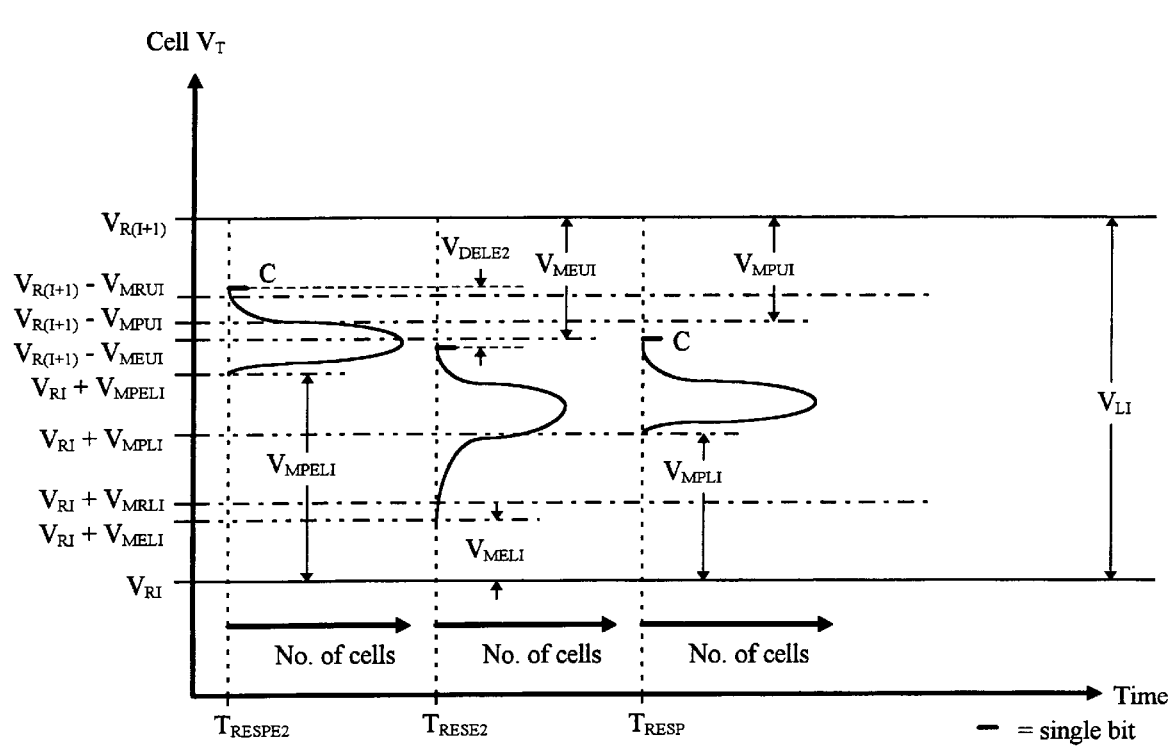
FIG._13B.

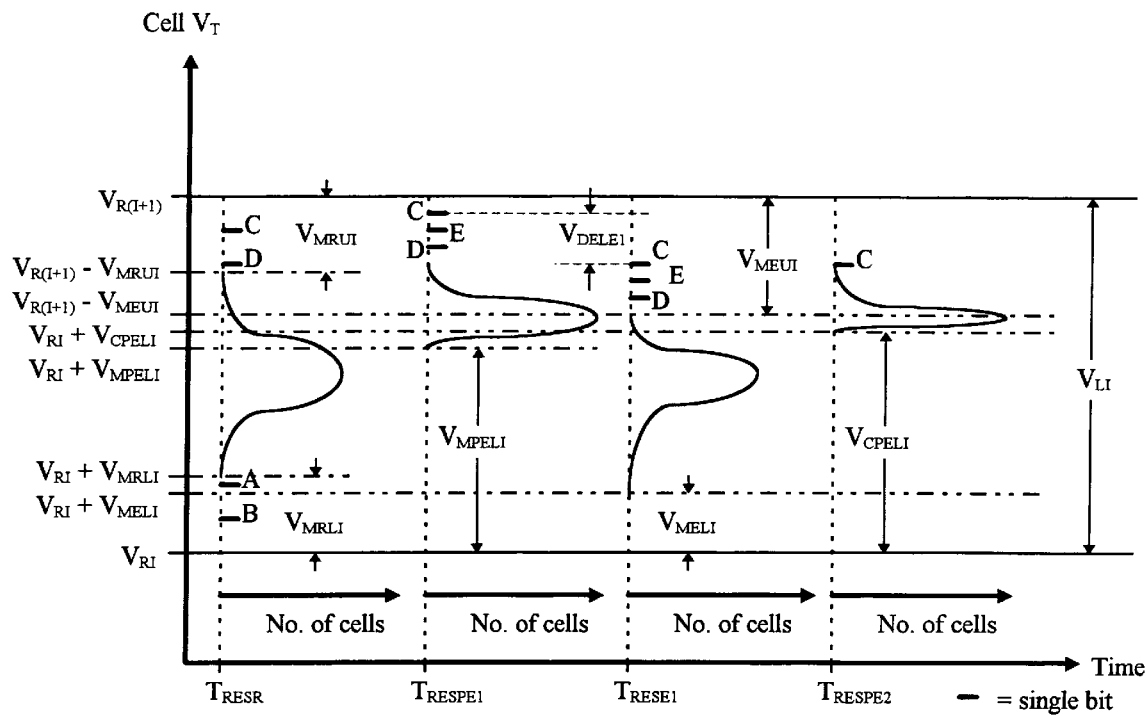
FIG._14A.
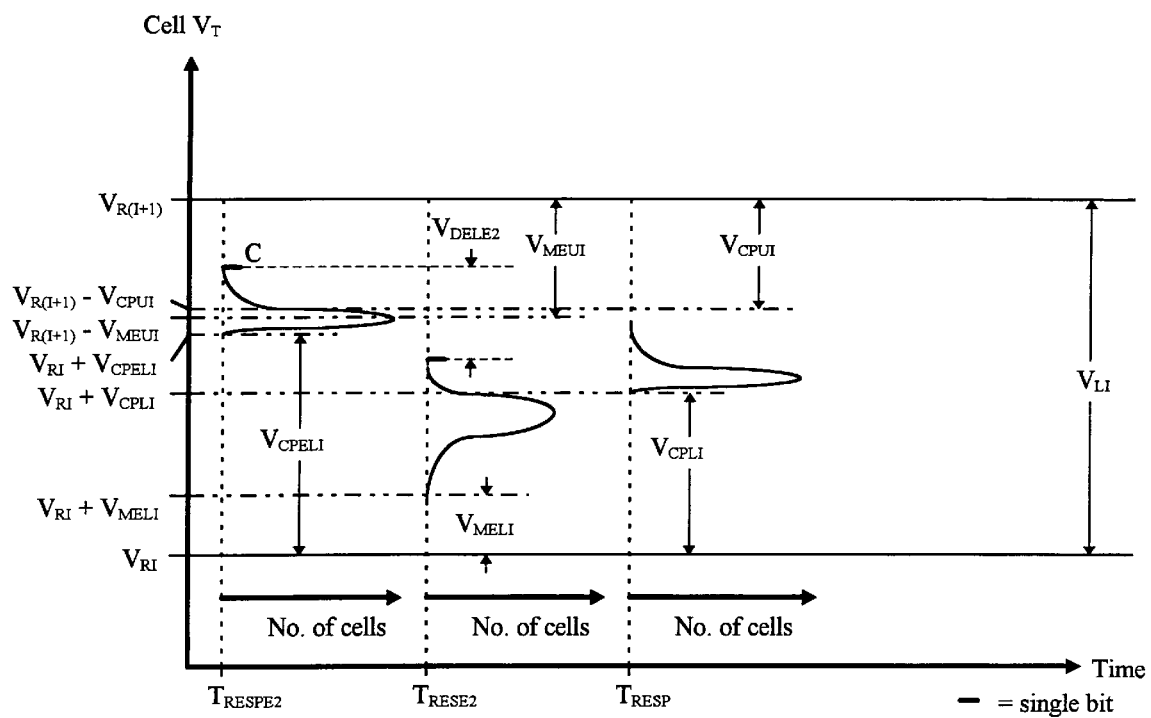
FIG._14B.

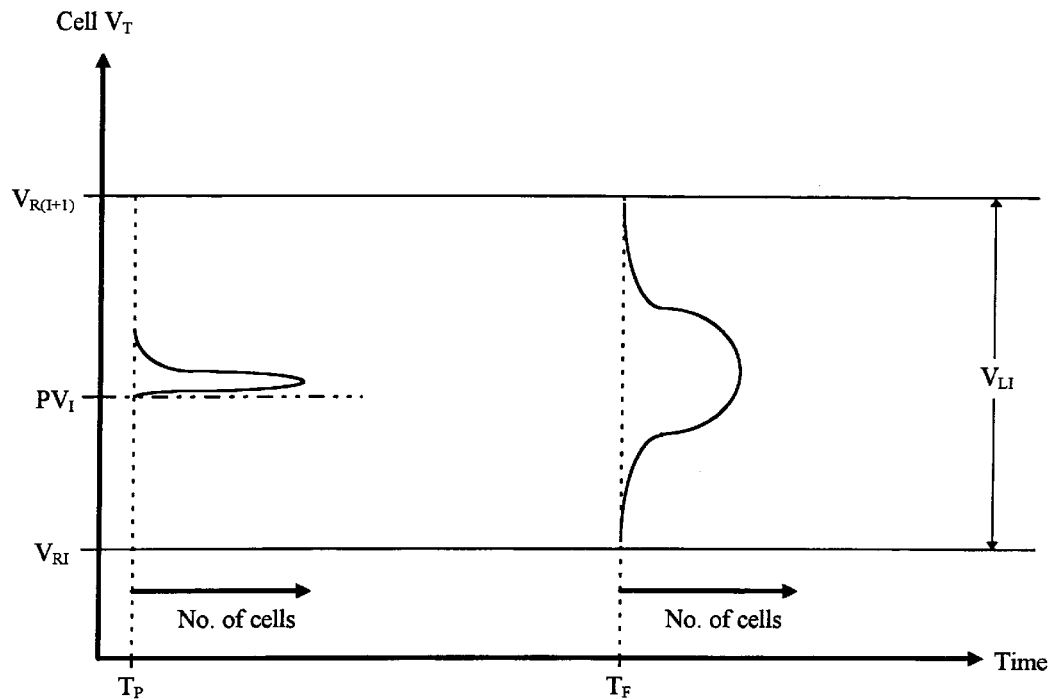
*Prior Art*
FIG._15A.
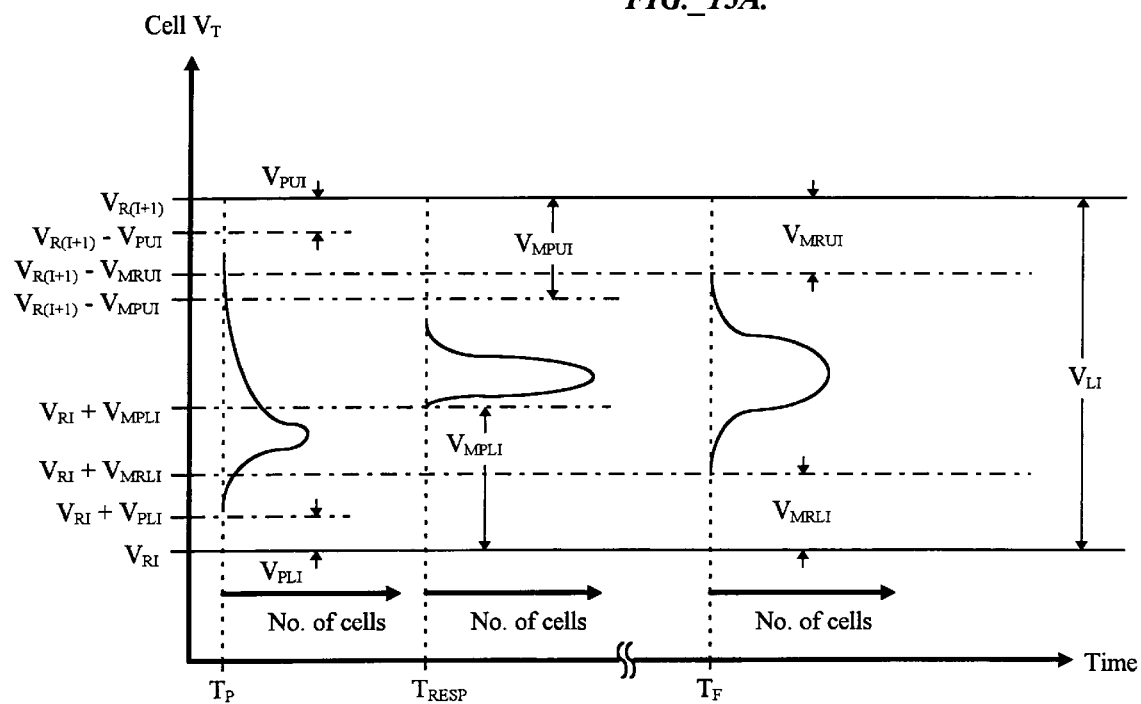
FIG._15B.

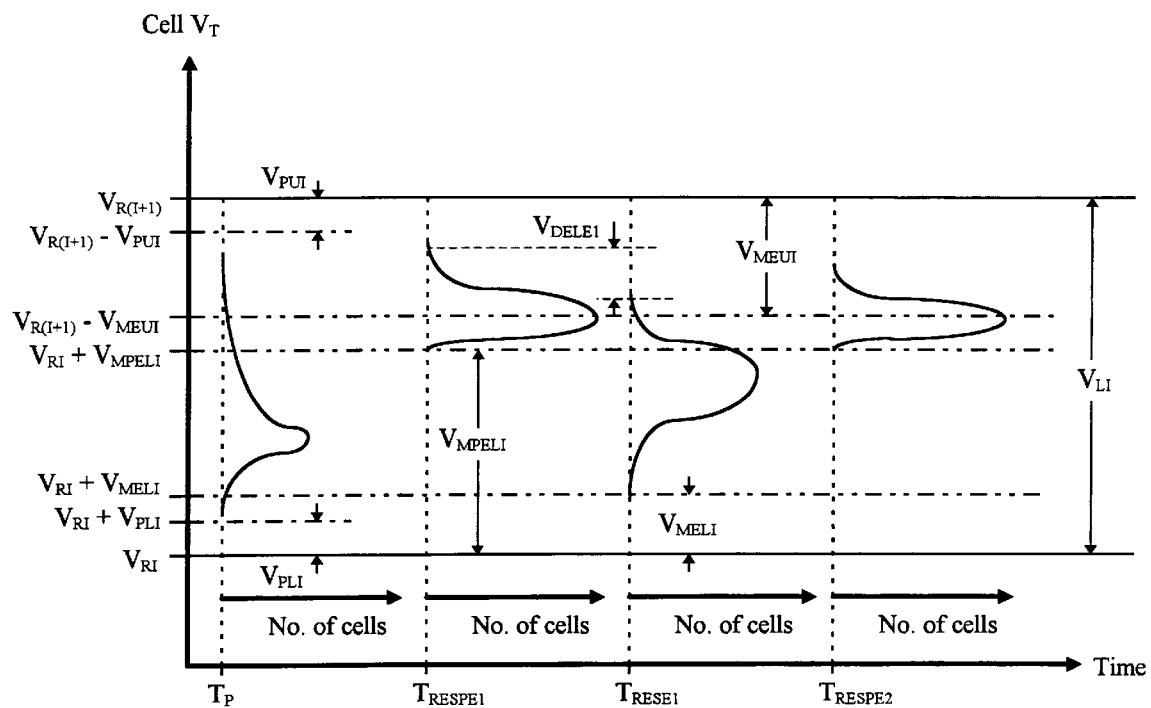
FIG._16A.
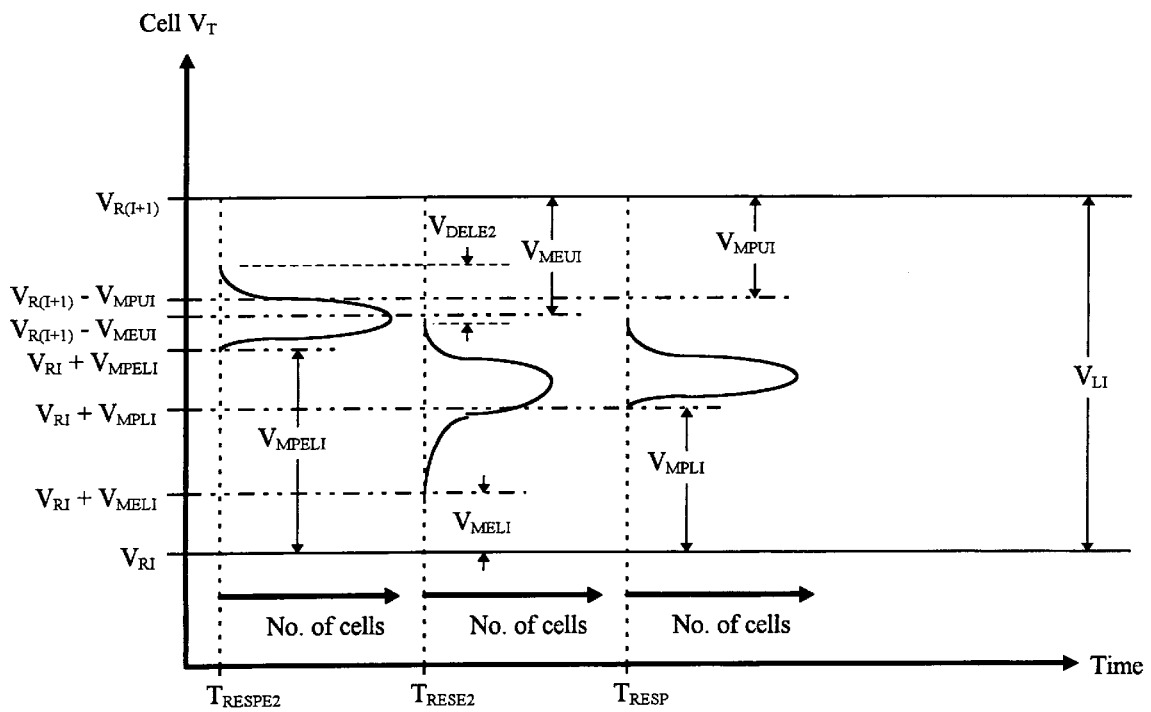
FIG._16B.

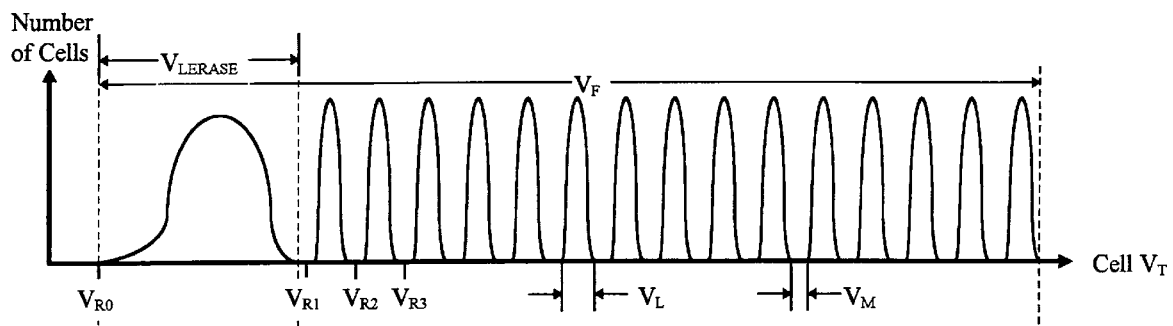
FIG._17A.
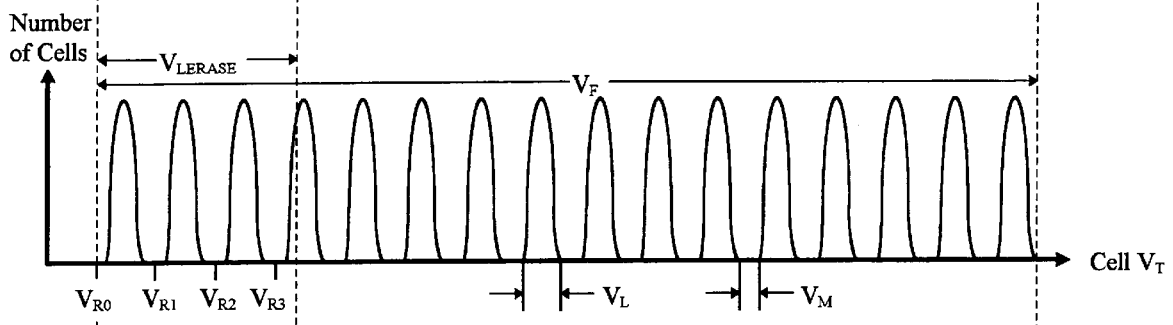
FIG._17B.
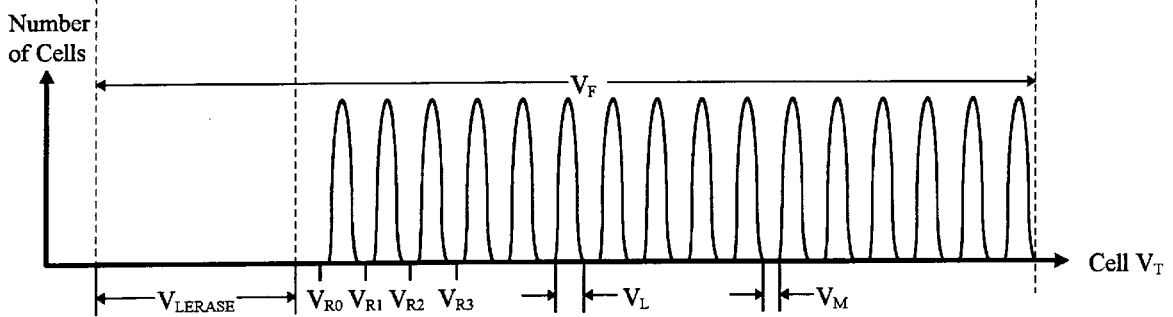
FIG._17C.

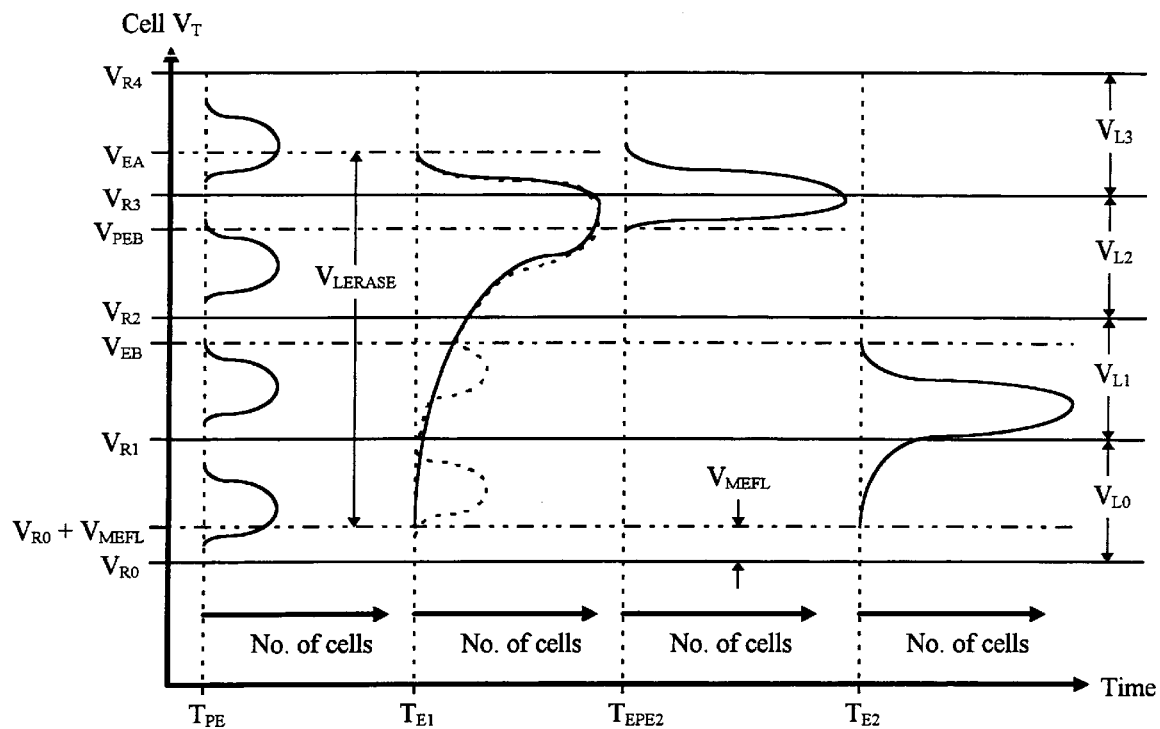
FIG._18A.
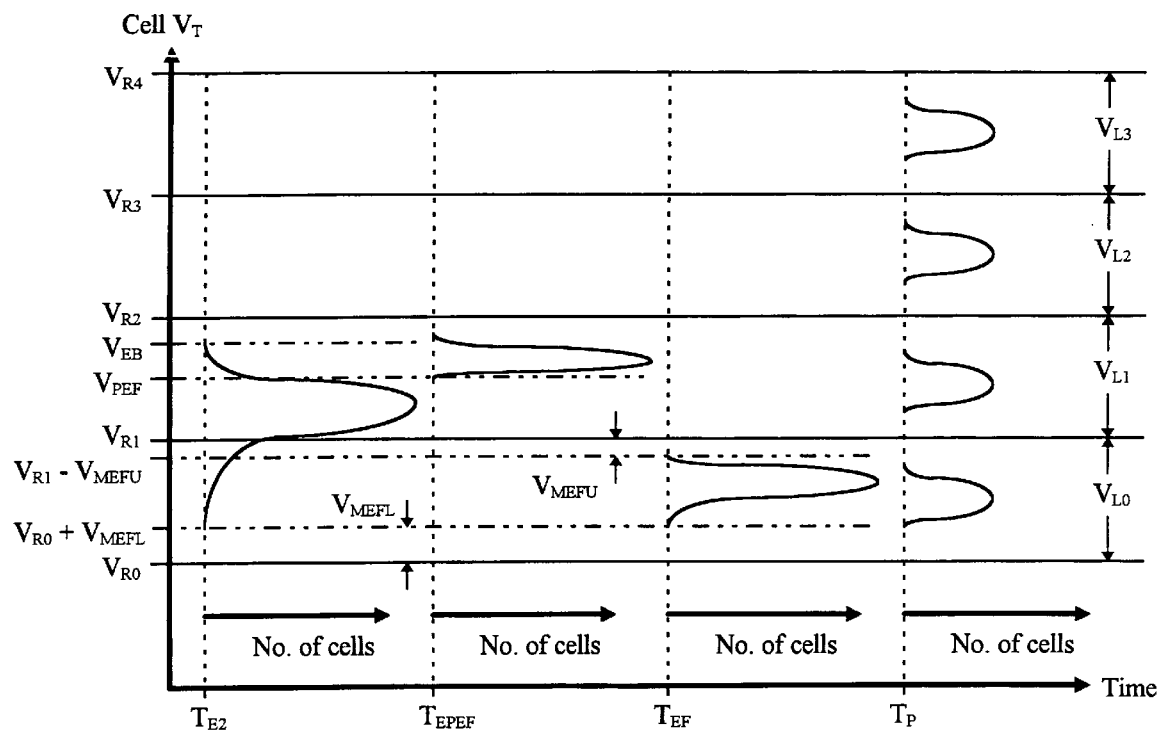
FIG._18B.

STABILIZATION CIRCUITS AND TECHNIQUES FOR STORAGE AND RETRIEVAL OF SINGLE OR MULTIPLE DIGITAL BITS PER MEMORY CELL

This application is a continuation of and claims the benefit of U.S. application Ser. No. 08/640,367, U.S. Pat. No. 5,815,439 filed Apr. 30, 1996, the disclosure of which is incorporated by reference.

FIELD OF THE INVENTION

This invention relates in general to semiconductor memories and, in particular, to the stabilization of semiconductor memories subject to drift effects. Such memories may store one or more digital bits per memory cell.

BACKGROUND OF THE INVENTION

Semiconductor memory integrated circuits, such as EEPROM, EPROM, FLASH and DRAM, have traditionally been used to store a single digital bit per memory cell, which is termed hereafter as single bit storage. Memories capable of storing more than one bit of digital data per memory cell and their benefits have been described previously. Such multiple bit per cell memories are called multilevel memories because they require more than the conventional two (conducting vs. non-conducting) cell threshold voltage, $V_T$, levels that are used for single bit storage techniques.

Each level in a multilevel memory cell represents a specific range of electrical charge stored in each memory cell and, in the case of nonvolatile memories, i.e., EEPROM, EPROM, and FLASH memories, represents a specific range of cell $V_T$ values. To store N bits per memory cell requires the cell's $V_T$ range, and the amount of stored charge, to be divided into $2^N$ levels. Each level corresponds to a unique binary data pattern for all N bits. The cell is erased or programmed to store charge such that the cell's $V_T$ is set within one of these $2^N$ levels. Sensing circuits determine which level the storage cell's $V_T$ is in and read out the corresponding binary data pattern stored for the N bits. Digital information can thus be stored at a significantly lower cost per bit since N times the number of bits can be stored in the same memory cell array area previously storing just a single bit per cell.

In the following description for nonvolatile memory, a "level" is referred to as a range of $V_T$ values and not as a single voltage value. Furthermore, the term, cell $V_T$, is not used in the strictest sense defined by solid state device physics, but rather in terms of how the sensing circuits determine the conductivity state of the memory cell. The conductivity is related to the $V_T$ of the cell. Similarly, a DRAM level represents a range of stored charge and not a single charge value.

The operation of sensing individual levels is performed by comparing the conductivity (or stored charge) of the memory cell in terms of sensing voltage or current with respect to multiple reference voltages or currents. The present invention is described in terms of voltage sensing since currents can easily be converted to voltages via load circuits by those practiced in the art of sensing schemes.

There are many problems associated with multilevel memories. Typically $2^N-1$ or $2^N$ reference voltage values, $V_{RI}$, where I=1, 2, ..., $2^N-1$, or $2^N$, have been proposed to store N bits per memory cell to separate the $2^N$ levels from each another, with $V_{R1}<V_{R2}<...<V_{R(2^N)}$. It should be noted that a $V_{RI}$ is sometimes referred to as simply $V_R$ for brevity. The relationship between reference voltage values and cell $V_T$ are illustrated in FIGS. 1A–1C, which show the multilevel sensing reference voltages and cell $V_T$ distributions for a whole memory chip for single, two, and four bits stored per cell respectively.

An undesirable condition occurs when a memory cell $V_T$ is close to one of the $V_R$ voltages. The determination of the cell $V_T$ becomes ambiguous. Practical sensing circuits that determine cell $V_T$ are limited by circuit stability and speed, and by voltage and current variations caused by digital switching noise and other variations in power supply voltage, temperature, and silicon processing. Unlike analog signal storage, which does not require discrete multiple levels nor multiple reference voltages, digital memory storage techniques require the level to be unambiguously determined and requires such discrete reference voltages. If the level in a cell is incorrectly sensed, the digital memory malfunctions and up to N bits per cell may be lost.

To avoid the problems of sensing cell $V_T$ values close to, or equal to, one of the $V_R$ voltages, a margin voltage range, $V_{MPI}$ (see FIG. 2), to separate the cell's $V_T$ in one level from other adjacent levels has been proposed. This separation is performed at the time the cell is erased and programmed. However, both ends of each $V_{MPI}$ range are not defined. Rather, this proposed technique uses statistical control over the silicon process in conjunction with a lengthy programming algorithm to create adequate $V_{MPI}$ for storing a single bit, and possibly two bits, per cell. Additionally, no mechanism exists to determine if a cell $V_T$ overshoots the desired range. However, the technique is reliable only when two conditions are met. First, the separation between $V_R$ values must be large enough to provide adequate margin for unambiguous sensing. Secondly, the cell's $V_T$ must remain stable within the desired level and for as long as the data is to remain valid. This period may be as long as the lifetime of the memory chip.

However, a problem all multilevel storage techniques must overcome is the control of the $V_T$ of the memory cell within a very narrow range for each level. This $V_T$ control problem applies to all operational modes of the memory, including programming, erasing and reading the memory cells. The severity of the $V_T$ control problem increases geometrically as the number of bits stored per memory cell increases since $2^N$ levels per cell are required to store N bits per cell. The range of $V_T$ values within a single level, $V_L$, and the margin range separating the cell $V_T$ in different levels, $V_M$ (see FIGS. 3A–C), narrows as the number of levels increase within a fixed range of all useful cell $V_T$ values, $V_F$. In this invention we sometimes refer to a $V_{LI}$ (where I is one of the $2^N$ levels) as simply $V_L$, for brevity's sake.

$V_F$ is usually fixed since it is limited by the voltage range that can be applied to the terminals of the memory cell during the program, erase, and sensing operations. $V_F$ is constrained by circuit speed, complexity and data storage reliability. For many previously proposed nonvolatile memory technologies, $V_F$ is roughly equal to the power supply voltage for read operation, $V_{CC}$.

For the extremely simple case where the $V_L$ range for all levels are defined to be the same and there is zero margin between levels, $V_L=V_F/2^N$. For example, the $V_L$ range for a single bit storage technique operating from a 5 volt $V_{CC}$ is 5/2=2.5V, while the $V_L$ range for a 4-bit per cell multilevel memory operating from 3V reduces to 3/16=187.5 mV. If a margin voltage range, $V_M$, is added between each level, $V_F=V_{L1}+V_{M1}+V_{L2}+V_{M2}+...+V_{M(2^N-1)}+V_{L(2^N)}$. Continuing with the previous simple case and assuming all $V_M$ ranges are also equal, the level range now reduces to $V_L=[V_F-(2^N-1)\times V_M]/2^N$. With the introduction of a $V_M$ equal to 0.1V, the $V_L$ in the previous 4-bit, 3-volt $V_{CC}$ example is now reduced to $[3-(15\times 0.1)]/16=93.8$ mV.

Adding to the $V_T$ control problem is the procedure for erasing memory cells. In practical embodiments of memory arrays, the erasure of cells is accomplished in blocks containing many cells so the $V_T$ distribution of the fully erased cells is wider than the other levels that are programmed more selectively. The wider $V_L$ level used to define the fully erased cells, $V_{LERASE}$, reduces the $V_L$ range for the programmed levels even further. FIGS. 3A through 3C graphically illustrate this problem for the same technologies shown in FIGS. 1A–1C.

It should be noted that FIGS. 1A, 1B, 1C, 2, 3A, 3B, and 3C are examples of technologies where programming increases the cell $V_T$. The previous statements apply analogously for technologies that decrease the cell $V_T$ during programming. In this case these drawings would show the wider erased level at the high end of cell $V_T$, instead of the low end.

Thus, $V_T$ control is much more important in multilevel than in single bit storage systems since the range of $V_T$ in each level is geometrically reduced as the number of bits per cell increases.

Furthermore, there are various mechanisms which can cause the cell's $V_T$ to drift away from its initially programmed value. Many of these mechanisms are caused by the application of voltage stresses to the cell subsequent to its original programming. These conditions are called "disturbs" and are unavoidable when the cell is grouped within an array of other similar cells to make a useful memory system. Program and erase disturbs are present for the shortest cumulative time but are important causes of $V_T$ drift due to the high voltages used during these operations. For example, disturb data is routinely reported in the technical literature describing new FLASH memory technology.

Other sources of $V_T$ drift are due to the effects of changes in the numbers or positions of trapped charges around the floating gate or between the floating gate and substrate of the memory cell. Trapped charges may be due to defects or the cumulative effects of high electric fields applied over time, such as during repeated program/erase (P/E) cycles. The more erase or programming currents are driven through a gate dielectric, the more trapped charges accumulate. This leads eventually to the retardation of those operations and a malfunction of the part.

Trapped charge may also occur in an unrepeatable fashion with P/E cycling. This has been attributed to the so called "rogue bit" effect. A rogue bit exhibits a shift in programming or erase ability on one cycle and reverts back to normal on another cycle. The rate of $V_T$ drift may not be constant over time and may not be the same from cell to cell due to the statistical variations of the defects present. Each cell in a memory cell array experiences its own unique combination of disturb and charge stress conditions since different rows and columns, within which the cells are interconnected, are accessed in various orders. The drift effects caused by random voltage stresses are added to the drift effects caused by the random defects. These effects are cumulative on the cell's $V_T$ drift.

Nonvolatile cells eventually loose endurance with repeated P/E cycles, that is, they program or erase too slowly for the time allowed for these operations and eventually fail. Some previous programming techniques count the number of times a particular section of memory cell array has been cycled. Such cycling data is then used, in one example, to prevent further P/E cycling of that overused section of memory cell array based on a predetermined conservative maximum number of cycles. This programming technique may thus act to reduce the functionality of the memory before being necessary.

Finally, all the $V_T$ disturb and drift mechanism problems described above worsen due to the increasing electric fields in the cell as the physical sizes of memory cells are reduced. These problems are known impediments to the scaling of cells and barriers to more economical memory chips. Cell $V_T$ drift problems become even more severe as the $V_L$ range is narrowed when storing multiple bits per cell or lower power supply voltages are used, for example.

The present invention solves or substantially mitigates these problems. A memory according to the present invention directly measures the stability, programmability, and erasability of each nonvolatile memory cell over the life of the part.

SUMMARY OF THE INVENTION

The present invention provides for an integrated circuit memory system which has a plurality of memory cells with each memory cell having a stored charge in one of a plurality of levels corresponding to digital information. The memory system further includes circuitry which restores the charge in each memory cell responsive to a predetermined amount of change in the charge in the memory cell to avoid loss of digital information in the memory cell. Charge restoration is performed by mini-programming and mini-erasing operations which moves only enough electric charge into and out of the memory cell sufficient to move the stored charge back to its original value as defined by a first set of special reference voltage values.

The integrated circuit memory system also has circuitry for novel programming and erasing operations. During the programming of memory cells, the memory system writes a charge in one of a plurality of levels corresponding to digital information into each of the memory cells being programmed. The levels are defined by a second set of special reference voltage values, which define the levels more widely than the first set of special reference voltage values. Later, mini-programming and mini-erasing operations are performed, as required, to narrow the range of stored charges into levels defined by the first set of special reference voltage values. The initial wide range of stored charges speeds the programming of the memory cells.

During the erasing of memory cells, the memory system narrows the range of stored charges in the level of erased memory cells by special reference voltage values. The narrowed erased level increases the spread between levels corresponding to digital information. This increases the safety margin between levels or permits an increase in the number of bits which might be stored in the memory cells.

BRIEF DESCRIPTION OF THE DRAWINGS

FIG. 1A is a prior art example of the sensing reference voltages and cell $V_T$ distributions for a whole memory chip for single bit per cell data storage.

FIG. 1B is a prior art example of the sensing reference voltages and cell $V_T$ distributions for a whole memory chip for two bit per cell data storage.

FIG. 1C is an example of the sensing reference voltages and cell $V_T$ distributions for a whole memory chip for four bit per cell data storage.

FIG. 2 is a particular prior art example of the sensing reference voltages for read, program, and erase modes and resulting cell $V_T$ distributions for a whole memory chip for two bit per cell data storage showing the margins separating different $V_T$ levels.

FIG. 3A is a prior art example defining the ranges of $V_F$, $V_{LERASE}$, $V_M$, and $V_L$ cell $V_T$ distributions for a whole memory chip for single bit per cell data storage.

FIG. 3B is a prior art example defining the ranges of $V_F$, $V_{LERASE}$, $V_M$, and $V_L$ cell $V_T$ distributions for a whole memory chip for two bit per cell data storage.

FIG. 3C is an example defining the ranges of $V_F$, $V_{LERASE}$, $V_M$, and $V_L$ cell $V_T$ distributions for a whole memory chip for four bit per cell data storage.

FIG. 4A is an example of cell $V_T$ drift versus time for rising $V_T$.

FIG. 4B is an example of cell $V_T$ drift versus time for falling $V_T$.

FIG. 5A is an example of cell $V_T$ drift versus time for rising $V_T$ showing the two new multilevel digital read sensing reference voltages and guard bands for a given level.

FIG. 5B is an example of cell $V_T$ drift versus time for falling $V_T$ showing the two new multilevel digital read sensing reference voltages and guard bands for a given level.

FIG. 6 shows the general operation of the preferred embodiment of the BSERD technique for sensing four bits of multilevel digital data per memory cell.

FIG. 7 is a block diagram of a preferred embodiment of this invention.

FIG. 8 is a flow chart of the BSERD technique as implemented in the preferred embodiment.

FIG. 10 is the timing diagram for the example shown in FIG. 9.

FIG. 11 is a block diagram showing the detailed organization of the memory array and the Y-DRIVERS for page mode operation of one embodiment of the present invention.

FIG. 12 is an example of the mini-programming technique showing the cell $V_T$ distributions of a plurality of cells in the memory at two different times and showing the two new mini-programming sensing reference voltages and guard bands which are within a given level.

FIG. 13A is an example of the mini-erasing technique showing the cell $V_T$ distributions of a plurality of cells in the memory at four different times and showing the new pre-erase mini-programming sensing reference voltage and guard band and the two new mini-erasing sensing reference voltages and guard bands which are within a given level.

FIG. 13B is a continuation of FIG. 13A and is an example of the mini-erasing technique showing the cell $V_T$ distributions of a plurality of cells in the memory at three different times and showing the new pre-erase mini-programming sensing reference voltage and guard band and the two new mini-erase sensing reference voltages and guard bands which are within a given level.

FIG. 14A is an example of the $V_T$ overshoot recovery technique showing the cell $V_T$ distributions of a plurality of cells in the memory at four different times and showing the new pre-erase micro-program sensing reference voltage and guard band which are within a given level.

FIG. 14B is a continuation of FIG. 14A and is an example of the $V_T$ overshoot recovery technique showing the cell $V_T$ distributions of a plurality of cells in the memory at three different times and showing the new pre-erase micro-program sensing reference voltage and guard band and the two new micro-program sensing reference voltages and guard bands which are within a given level.

FIG. 15A is a prior art example showing the initially tight cell $V_T$ distribution of a plurality of cells which are within a given level in the memory immediately after programming and showing the substantially widened distribution of the same cells after a long period of time just at the point of ambiguous sensing failure.

FIG. 15B is an example showing the two new programming sensing reference voltages and guard bands and the cell $V_T$ distributions of a plurality of cells in the memory which are within a given level at three different times; the initially wide cell $V_T$ distribution immediately after the first part programming, the tight distribution immediately after the second part programming, and the restored distribution of the same cells after the same long period of time as indicated in FIG. 15A during which the restore technique has been applied preventing ambiguous sensing failure.

FIG. 16A is an example of the programming technique showing the cell $V_T$ distributions of a plurality of cells in the memory at four different times and showing the two new programming sensing reference voltages and guard bands which are within a given level.

FIG. 16B is a continuation of FIG. 16A and is an example of the mini-erasing technique showing the cell $V_T$ distributions of a plurality of cells in the memory at three different times within a given level.

FIG. 17A is an example defining the ranges of $V_F$, $V_{LERASE}$, $V_M$, and $V_L$ cell $V_T$ distributions for an erase block for four bit per cell data storage where $V_{LERASE}$ is used for $V_{L0}$ similar to previously used techniques.

FIG. 17B is an example defining the ranges of $V_F$, $V_{LERASE}$, $V_M$, and $V_L$ cell $V_T$ distributions for an erase block for four bit per cell data storage where $V_{LERASE}$ is not used for $V_{L0}$ and where the $V_L$ levels are spread out over the whole $V_F$ range resulting in wider $V_L$ and $V_M$ ranges than in FIG. 17A.

FIG. 17C is an example defining the ranges of $V_F$, $V_{LERASE}$, $V_M$, and $V_L$ cell $V_T$ distributions for an erase block for four bit per cell data storage where $V_{LERASE}$ is not used for $V_{L0}$ and where the $V_L$ levels are not overlapping the $V_{LERASE}$ range which may be necessary for more reliable data sensing in some technologies.

FIG. 18A is an example of the erasing technique showing the cell $V_T$ distributions of a plurality of cells in an erase block over four levels at four different times and showing the four new erasing sensing reference voltages and the new $V_{MEFL}$ guard band which is within the $V_{L0}$ level.

FIG. 18B is a continuation of FIG. 18A and is an example of the erasing technique showing the cell $V_T$ distributions of a plurality of cells in an erase block over four levels at four different times and showing the two new erasing sensing reference voltages and the new $V_{MEFU}$ guard band which is within the $V_{L0}$ level.

DESCRIPTION OF THE PREFERRED EMBODIMENTS

Figure 9:
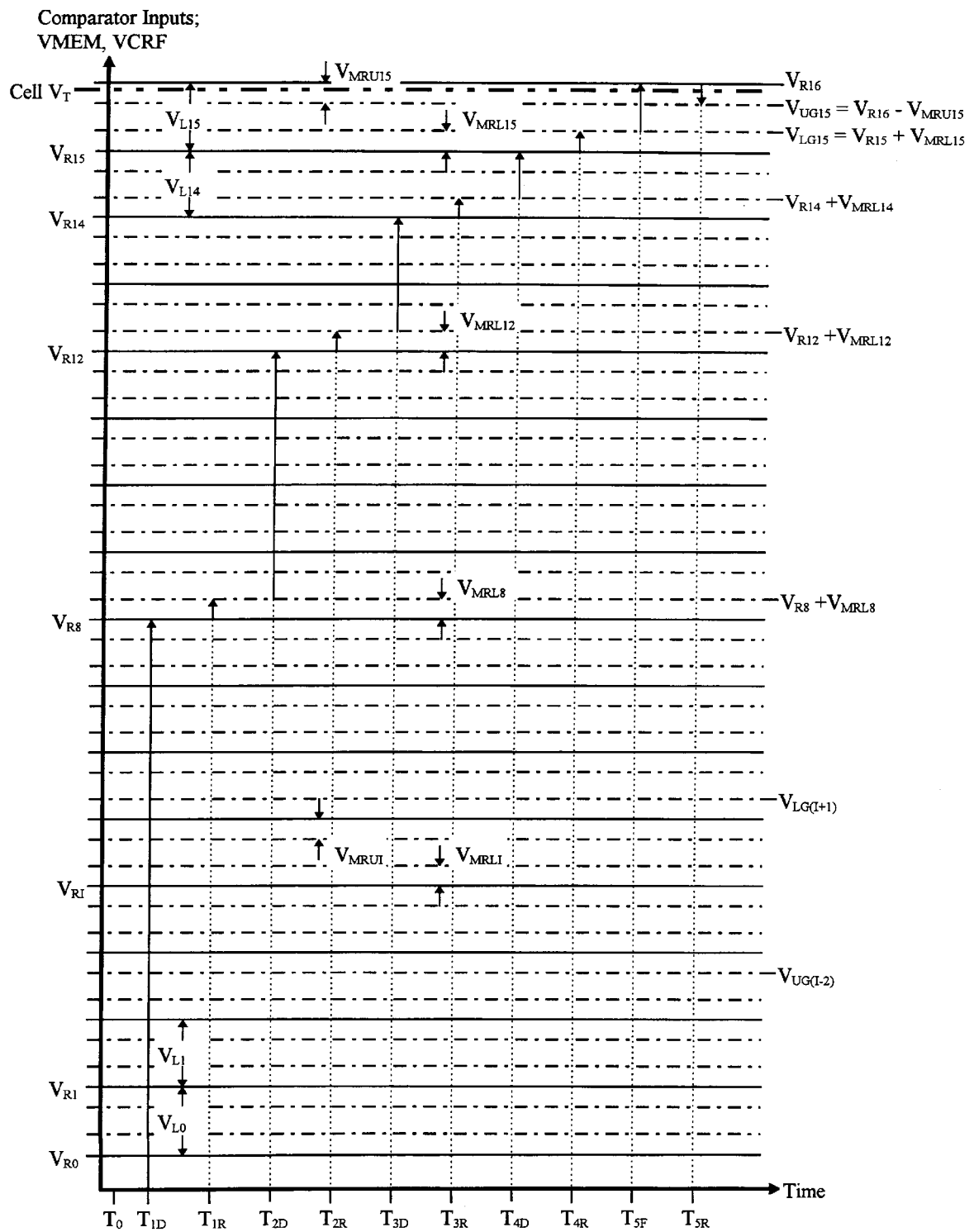
FIG. 9 shows an example of sensing multilevel digital data from a memory cell using the BSERD technique.

To avoid the problems described above, a memory system according to the present invention makes minor adjustments of the cell $V_T$ which automatically correct for drift effects, even long after programming. The cell $V_T$ is restored to the optimum value within the correct $V_{LI}$ range. This restore operation is performed as required to maintain adequate sensing margins for reliable data storage over the life of the memory. The memory system determines when a memory cell's $V_T$ should be restored by additional sensing reference voltages which determine when the cell's $V_T$ is too close to one of the $V_R$ values on either side of the desired $V_L$ range.

This invention also contrasts with previous analog storage techniques which do not use multiple levels separated by discrete sensing reference voltages. Such analog techniques cannot detect nor correct for cell drift or disturb effects once the original analog signal is corrupted by $V_T$ drift.

A cell's $V_T$ may move in one of three paths:

$V_T$ rising (for example, when electrons are being added to the floating gate as shown in FIG. 4A), $V_T$ falling (for example, when electrons are being removed from the floating gate as shown in FIG. 4B), and Stable $V_T$ due to a balance of charges or lack of stress conditions.

The memory of the present invention responds to any of the above three possibilities for each memory cell and determines the action necessary to restore the cell $V_T$. This response and determination may occur long after the original data programming. The memory system does not necessarily perform an erase before programming. Instead, the memory performs mini-erase and mini-program operations which adjust the $V_T$ in the correct direction. Only a small amount of stored charge required to make the minor $V_T$ restoration is moved during these operations. This avoids disturbing the data on other cells. The wearing effects of previous P/E cycling techniques are minimized.

Additionally, the memory system corrects rogue bits that are created during the large charge flux through the gate dielectric during a normal P/E cycle. During a restore operation, only small changes in the cell $V_T$ are required to restore the $V_T$.

FLASH nonvolatile memory cell arrays are normally optimized to reduce the chip's silicon area by requiring that cells be electrically erased in large groups called sectors, or erase blocks. Programming is accomplished in a much more selective way such that fewer bits are simultaneously programmed in a smaller group, such as a page, word, or byte. All the cells within the programming page, word, or byte may also be sensed (read or verified) simultaneously. An erase sector or block may contain multiple programming pages.

Programming shifts the $V_T$ of a memory cell in the opposite direction than erasure does. It should be noted that the definitions for programming and erasure used herein are not tied to the polarity nor direction of charge movement onto a charge storage region, such as a floating gate, but instead are determined by the memory cell array. Thus, the present invention is applicable to both technologies which program by increasing or decreasing the cell $V_T$.

In programming the integrated circuit cells, the memory system first completely erases all the cells in the erase block prior to programming any new data bits into any page within that erase block. Previous programming algorithms program each cell to the desired $V_T$ in a series of programming pulses. Multilevel programming prefers that the $V_T$ of each cell be individually set to obtain the tightest possible $V_L$ during programming, in anticipation of future drift. Previous multilevel programming algorithms require many program/verify iterations to shift the cell $V_T$ in one direction. Statistical process control is heavily relied upon to prevent the fastest programming cells' $V_T$ from overshooting the desired range within a level and resting too close to a $V_R$. To avoid overshoot, many small programming iterations are required.

In contrast, the programming operation of the memory system described herein may shift the cell's $V_T$ in both directions employing mini-erase operations during the programming mode. The mini-erase operations allow large programming iterations to be performed. Both edges of each $V_L$ range are controlled during programming, rather than relying on statistical control of the programming characteristics of each cell. Another advantage of the programming technique described below is that the programming time for a multilevel memory is reduced since the mini-programming and mini-erase operations reduce the initially programmed wide cell $V_T$ distribution in each level and correct any $V_T$ overshoot.

With the present invention, a memory system can determine when a cell is no longer capable of reliably programming, erasing or storing data by direct measurement while embedded in the external system. Appropriate action is taken only after determining that such action is immediately required. This extends the useful life of the memory chip.

The various aspects of a memory system according to the present invention are described in greater detail below. The multilevel data sensing, mini-programming, mini-erasing, programming and erasing operations follow:

I. Multilevel Digital Data Sensing

General Description of Sensing Operations

The present invention provides for a novel multilevel digital data sensing technique. The technique uses additional reference voltages and guard bands during sensing operations to determine whether a memory cell $V_T$ has drifted undesirably close to either one of the level separation reference voltages $V_{RI}$ or $V_{R(I+1)}$, which define one of the $V_{LI}$ levels.

As shown in FIG. 5A and FIG. 5B, the reference voltages $V_{UGI}$ and $V_{LGI}$, introduce cell $V_T$ read margin guard bands during the sensing mode. For each level "I", there are two read margin guard bands; 1) the upper read margin guard band, $V_{MRUI}=V_{R(I+1)}-V_{UGI}$, and 2) the lower read margin guard band, $V_{MRLI}=V_{LGI}-V_{RI}$. The guard bands $V_{MRUI}$ and $V_{MRLI}$ are referenced with respect to the $V_{RI}$. For example, the $V_{MRUI}$ is referenced with respect to $V_{R(I+1)}$ and the $V_{MRLI}$ is referenced with respect to $V_{RI}$. The total read margin guard band around a $V_{RI}$ is $V_{MRI}=V_{MRU(I-1)}+V_{MRLI}$.

If the new multilevel digital data sensing technique detects that a cell $V_T$ has drifted into one of the read margin guards bands, then a restore cycle condition is established and a conditional status flag is set. The new multilevel digital data sensing technique also uses ($2^N$+1) level separation reference voltages, $V_{RI}$, where N is the number of multilevel digital bits stored per memory cell and I=0 to ($2^N$+1). Two additional read margin guard bands are also used to sense whether a cell has drifted into the extreme limits of reliable data sensing.

Binary Search Embedded Restore Detection Methodology

The new multilevel digital data sensing technique, called the Binary Search Embedded Restore Detection (BSERD) technique, senses the multiple bits of data that are stored per memory cell as multilevel digital data, and determines whether a restore cycle condition is established using band sensing detection.

FIG. 6 shows the general operation of a preferred embodiment of the BSERD technique for sensing four bits (N=4) of multilevel digital data per memory cell. The choice of N=4 for this embodiment is only for the purpose of teaching this invention and does not limit the application of this invention to other choices for N. This invention could, for example, be used for single bit per cell storage (N=1) or any other multibit storage applications where N>1.

During each "Set BitX" cycle (X=0 to N−1), two subcycle operations are performed. These subcycles are the data detection subcycle followed by the restore detection subcycle. During each of the subcycles, a suitable reference voltage VCRF is set and compared with the sensed cell $V_T$. The VCRF voltage at a certain time point depends on the results of the comparisons between the VCRF voltage and the sensed cell $V_T$ at each of the previous time points. After the requisite number of Set BitX cycles are finished, a fringe detection subcycle and a fringe restore subcycle are performed to detect whether the cell $V_T$ is within the extreme reliable limits of the cell $V_T$ sensing range and whether the cell $V_T$ is within the extreme upper or lower restore margin range.

Multilevel Memory Sensing System

FIG. 7 shows the block diagram of a preferred embodiment of the invention. Four bits of multilevel digital data are sensed from each memory cell. Data, address, control, and system clock signals are interfaced between the outside system and the preferred embodiment by a DATA, ADDR & CNTRL SYSTEM INTERFACE block 10 via a DATA bus 11, an ADDR bus 12, a CNTRL bus 13 and a CLKIN line 14 respectively. Alternatively, an internal CLOCK block (not shown in FIG. 7) generates a clock signal on a CLCK signal line 15, shown in FIG. 7. During sensing operations, the DATA, ADDR & CNTRL SYSTEM INTERFACE block 10 provides the address information over a bi-directional address, ADDRBUS bus 16, to a respective horizontal decoder, X-DEC 17, a vertical decoder, Y-DEC 18, and a block decoder, BLOCK-DEC 19, to select an appropriate memory cell 20, in a memory array block, CELL ARRAY 21.

The decoders provide the appropriate multilevel programming, erase, or sensing voltages at the terminals of the cell 20, depending on signals on a PRG-ERS control bus 22, a HVCTRL control bus 23, a PRGHV high voltage line 24, and a HVOUT high voltage bus 25. The PRG-ERS and HVCTRL signals are generated by a PROGRAM ERASE READ RESTORE SEQUENCER block 26. The HVOUT and PRGHV signals are generated by a HVGEN block 27.

During sensing, a RD line 28 is forced high to turn on a GATEC switch 29 to connect a MLLINE line 30 to a VMEM line 31. The MLLINE line 30 is connected to the cell 20 through a Y-MUX block 32 and a BL00 bit line 71. The particular cell 20 which is connected to the MLLINE line 30 during sensing depends on the Y-MUX block 32, responsive to signals on a YDECO bus 34 generated by the Y-DEC block 18. The VMEM line 31 is connected to the noninverting input of a comparator CMP 35. When high, the RD line 28 also allows the connection of a load block circuit, CELL LOAD 36, to the VMEM line 31.

When the appropriate voltages are applied at the terminals of the addressed cell 20 and the CELL LOAD 36 is connected, a voltage representative of four bits of digital data is developed at the VMEM line 31. The PROGRAM ERASE READ RESTORE SEQUENCER block 26 also sends the signals through a PRGRDB bus 37 to reference voltage selection blocks, VX VY GEN block 38 and $\Delta$VU $\Delta$VL GEN block 39. The outputs of the VX VY GEN and the $\Delta$VU $\Delta$VL GEN blocks 38 and 39 are passed to a comparator reference voltage generation block, VCRFGEN block 40. Reference voltages are selected by the VX VY GEN and $\Delta$VU $\Delta$VL GEN blocks 38 and 39 from a VOLTAGE REFERENCES block 41 through a reference voltage bus, RVBUS 42.

During sensing operations, a BINARY SEARCH READ SEQUENCER block 43 and the PROGRAM ERASE READ RESTORE SEQUENCER block 26 control and sequence the BSERD technique synchronized by the clock signal on the CLCK line 15 from the DATA, ADDR & CNTRL SYSTEM INTERFACE block 10. The BINARY SEARCH READ SEQUENCER block 43 forces the appropriate data line on a bi-directional bus, DATABUS[0–3] 44.

The VCRFGEN block 40 also receives control signals from a control line, PHSSEL line 46, from the PROGRAM ERASE READ RESTORE SEQUENCER block 26 and a control line, STPDIR line 47, from a STPDIR latch 52. The STPDIR latch 52 is connected to the output terminal of the CMP comparator 35 by an output line VCMPO 49 and a transfer gate, GATEA 50. Based upon the input signals from the DATABUS[0–3] bus 44, the VX VY GEN block 38 and $\Delta$VU $\Delta$VL GEN block 39, generate the appropriate voltages to the VCRFGEN block 40. Table 1 shows the output voltages from the VCRFGEN block 40 on an output VCRF line 45, during sensing, based on levels on the PHSSEL and STPDIR lines 46 and 47. The VCRF line 45 is connected to the inverting input of the CMP comparator 35.

TABLE 1

| PHSSEL | STPDIR | Voltage at VCRF |
| --- | --- | --- |
| LOW | Don't Care | VX |
| HIGH | LOW | VX + $\Delta$VL |
| HIGH | HIGH | VY − $\Delta$VU |

FIG. 6 illustrates the reference voltages $V_{R0}$ through $V_{R16}$; any one of which generated as output by the VX VY GEN block 38 under the control signals of the PRGRDB bus 37 and the DATABUS[0–3] bus 44, which in turn are controlled by the sequencers 26 and 43. During sensing, the voltage outputs from the VX VY GEN block 38 are VX=$V_{RI}$ and $V_Y$=$V_{RI}$, where I is an integer number between 0 and 16, determined by the data lines on the DATABUS[0–3] bus 44. During sensing, as also shown in FIG. 6, the $\Delta$VU $\Delta$VL GEN block 39 generates output voltages $\Delta$VL and $\Delta$VU, where $\Delta$VL=$V_{MRLI}$, $\Delta$VU=$V_{MRU(I-1)}$, I=0 to 15, respectively.

A DATA[0–3] LATCHES block 48 has four latches that store the four bits from each memory cell 20 as sensed through the BSERD technique. The CMP comparator 35 compares the voltages at the VMEM input line 31 and the VCRF input line 45 and generates a logic high or low signal on the VCMPO output line 49. The VCMPO line 49 is driven to a logic high signal when the voltage on the VMEM line 31 is higher than the voltage on the VCRF line 45. Conversely, the VCMPO line is driven to a logic low signal when the voltage on the VMEM line 31 is lower than the voltage on the VCRF line 45.

Besides the transfer switch, GATEA 50, the output VCMPO line 49 is connected to the input of a transfer switch, GATEB 51. The output line of GATEA 50 connects to the input line of the STPDIR LATCH 52. The output line of GATEB 51 is connected to the input of a latch, RES LATCH 53. The PHSSEL line 46 from the PROGRAM ERASE READ RESTORE SEQUENCER block 26 controls the operation of the switches, GATEA 50 and GATEB 51. When the PHSSEL line 46 is high, the output line VCMPO 49 from the CMP comparator 35 is connected to the input of the RES LATCH 53 through the switch GATEB 51. When the PHSSEL line 46 is low, the VCMPO line 49 is connected to the input of the STPDIR LATCH 52 through the GATEA switch 50.

A RST line 54 from the PROGRAM ERASE READ RESTORE SEQUENCER block 26 is connected to both the STPDIR LATCH 52 and the RES LATCH 53. The two latches 52 and 53 are reset when the RST line 54 is logic high. When the RES LATCH 53 is reset, an output line from the latch 53, RES line 55, is low. The output STPDIR line 47 from the STPDIR LATCH 52 carries an inverted signal from the latch 52. When the STPDIR LATCH 52 is reset, the output STPDIR line 47 is high. The STPDIR line 47 is connected to a high voltage switch, HVSW 56, the VCRFGEN block 40, and transfer switches, GATED 57, GATEF 58 and GATEH 59. When the STPDIR line 47 is high, the HVSW switch 56 passes high voltage pulses on the PRGHV line 24, which is connected to the high voltage generator, HVGEN block 27, to the MLLINE line 30. When the STPDIR line 47 is low, the HVSW switch 56 disconnects the PRGHV line 24 from the MLLINE line 30.

The high voltage pulses are generated by the HVGEN block 27 when the HVCTRL bus 23 from the PROGRAM ERASE READ RESTORE SEQUENCER block 26 is forced to set a programming or erase operation. During sensing, the high voltage PRGHV line 24 is allowed to float and the HVGEN block 27 does not generate any high voltage pulses, since the HVCTRL bus is set for sensing. The HVGEN block 27 also provides high voltages through the HVOUT bus 25 to the Y-DEC block 18, the X-DEC block 17 and the BLOCK-DEC block 19 during the programming, the erase, the restore, and potentially also the sensing, operation modes.

The Y-MUX block 32 selects the appropriate bit (sense) line of the addressed cell 20 under the control of the Y-DEC block 18. A REGISTERS & ADDRESS BUFFER block 60 stores the addresses of the memory cells which should be restored along with the restore conditional status flags as determined by the BSERD technique. The REGISTERS & ADDRESS BUFFER block 60, connected to the ADDRBUS bus 16, is controlled by the PROGRAM ERASE READ RESTORE SEQUENCER block 26 via a BFCTLBUS bus 61.

GATED and GATEE switches 57 and 62 are connected in series to a GROUND line 64, which is set at a logic low signal. These switches 57 and 62 are controlled by signals on the STPDIR line 47 and RES line 55 respectively. Similarly, GATEF and GATEG switches 58 and 63 are connected in series to a POWER line 67, which is set at a logic high signal. These switches 58 and 63 are also controlled by the STPDIR line 47 and RES line 55 respectively.

When both the STPDIR line 47 and the RES line 55 are high together, a logic low signal is passed through the GATED and GATEE switches 57 and 62 to an FLGB line 65. Under any other combinations of signals on the STPDIR line 47 and the RES line 55, the logic low signal is not passed to the FLGB line 65 which allows a PULL UP LOAD block 66 to force a high logic signal on the FLGB line 65. When both the STPDIR line 47 and the RES line 55 are low together, a logic high signal is passed through the GATEF, GATEG switches 58 and 63 to a FUGB line 68. Under any other combinations of signals of the STPDIR line 47 and the RES line 55, the logic high signal is not passed to the FUGB line 68; a PULL DOWN LOAD block 69 then forces a low voltage on the FUGB line 68. The FLGB, FUGB lines 65 and 68 are input lines to the PROGRAM ERASE READ RESTORE SEQUENCER 26 and the BINARY SEARCH READ SEQUENCER block 43. A data latching pulse, generated by the PROGRAM ERASE READ RESTORE SEQUENCER block 26 and conducted through a LCHDAT line 70, passes through the GATEH switch 59 to the DATA [0–3] LATCHES block 48 when the STPDIR line 47 is low.

FIG. 8 shows the flow chart of the BSERD technique as implemented. The BINARY SEARCH READ SEQUENCER block 43 and the PROGRAM ERASE READ RESTORE SEQUENCER block 26 contain the necessary control circuitry to implement the BSERD technique. The design of the circuitry should be evident to one skilled in the art of integrated circuit design.

FIG. 9 shows an example of sensing multilevel digital data from a memory cell. The arrows in FIG. 9 show the transitions of the reference voltages at the VCRF input line 45 into the CMP comparator 35 at certain time points responsive to the condition of the output of the CMP 35 at each of the previous time points, as shown on the time axis.

FIG. 10 shows the exemplary timing diagram for sensing multilevel digital data from a memory cell 20, as shown in FIG. 9 and described hereafter. The cell $V_T$ of the selected cell 20 which has been appropriately programmed previously is sensed on the VMEM line 31 (see FIG. 7) to be at the dark dotted horizontal line, shown as "Cell $V_T$" in FIG. 9. At time $T_0$, the beginning of the BSERD technique, the RST line 54 is pulsed high to reset the STPDIR and the RES latches 52 and 53. The PRGRDB bus 37 is set, the PHSSEL line 46 is low, the HVCTRL bus 23 is set for sensing, the RD line 28 is high, and the ADDRBUS bus 16 contains the address of the selected memory cell being sensed. After a reset pulse on the line 54, the STPDIR line 47 is high and the RES line 55 is low. The FLGB line 65 is high and the FUGB line 68 is low.

Now the "Set BIT3" cycle (see FIG. 6) and the first data detection subcycle begins. The most significant bit line of the DATABUS[0–3] bus 44, Bit3, is forced high by the BINARY SEARCH READ SEQUENCER block 43. With Bit3 forced high, (0001) on the DATABUS[0–3] bus 44, the VX VY GEN block 38 outputs the reference voltage $V_{R8}$ at time $T_{1D}$, and the ΔVU ΔVL GEN block 39 outputs the reference voltages $V_{MRL8}$ and $V_{MRU7}$. Since the PHSSEL line 46 is low at this time, the VCRFGEN block 40 outputs the reference voltage $V_{R8}$ on the VCRF line 45. Just after time $T_{1D}$, the CMP comparator 35 senses that the VMEM line 31 is higher than the VCRF line 45 and generates a logic high on the VCMPO line 49. With the PHSSEL line 46 low, the GATEA switch 50 passes the logic high signal on the VCMPO line 49 to the input line of the STPDIR LATCH 52. The latch 52 is set and generates a logic low signal on the STPDIR line 47. With the STPDIR line 47 low, the latching pulse on the LCHDAT line 70 from the PROGRAM ERASE READ RESTORE SEQUENCER block 26 passes through the GATEH switch 59 to latch a "1" in a DATA3 latch in the DATA[0–3] LATCHES block 48. This marks the end of the data detection subcycle.

Next, the first restore detection subcycle begins. The PHSSEL line 46 is set high. Since the PHSSEL line 46 is high and the STPDIR line 47 is low, the VCRFGEN block 40 outputs the voltage ($V_{R8}+V_{MRL8}$) on the VCRF line 45 at time $T_{1R}$. The CMP comparator 35 senses that the signal on the VMEM line 31 is still higher than the signal on the VCRF line 45 and generates a logic high signal on the VCMPO line 49. Since the PHSSEL line 46 is logic high, the signal on the VCMPO line 49 passes to the RES LATCH 53 through the GATEB switch 51 and does not pass through the GATEA switch 50 to the STPDIR LATCH 52. Since the level is high at the input of the RES LATCH 53, the output RES line 55 is set high. This is the end of the first restore detection subcycle and the end of the "Set Bit3" cycle.

The BSERD technique performs the sequence of events and subcycles as described in the above paragraph, performing the Set BIT2, the Set BIT1 and the Set BIT0 cycles in sequence. FIG. 9 shows the reference voltages set at the VCRF line 45 at various time points. FIG. 10 shows the output logic voltages on the VCMPO line 49, STPDIR line 47, RES line 55, FLGB line 65, FUGB line 68 and the DATABUS[0–3] bus 44 at various discrete times. If at the end of one of the data detection subcycles, the output line VCMPO 49 from the CMP comparator 35 remains low, which signifies that the voltage on the VMEM line 31 is lower than the voltage on the VCRF line 45, then the STPDIR line 47 is high. When that occurs, no data latching pulse from the LCHDAT line 70 is passed through the GATEH switch 59. Then the appropriate data latch in the DATA[0–3] LATCHES block 48 remains reset at "0". This condition does not occur in this example. Similarly, if at the end of any of the restore detection subcycles, both the STPDIR line 47 and the RES line 55 become high, then a restore low cycle condition is established, with the FLGB line 65 being forced low. If at the end of any of the restore detection subcycles, both the STPDIR line 47 and the RES line 55 become low, then a restore high cycle condition is established, with the FUGB line 68 being forced high.

At the completion of the data detection and restore detection subcycles, the fringe detection and the fringe restore subcycles are performed by the BSERD technique. At the end of the final "Set BIT0" cycle in the prior example, the data on the DATABUS[0–3] bus 44 is (1111). At the beginning of the fringe detection subcycle, the PROGRAM ERASE READ RESTORE SEQUENCER block 26 senses (1111) on the DATABUS[0–3] bus 44 and sets the PRGRDB bus 37 to select the $V_{R16}$ reference voltage at the output of the VX VY GEN block 38 and the $V_{MRU15}$, $V_{MRL15}$ reference voltages at the output of the ΔVU ΔVL GEN block 39. The PHSSEL line 46 is low at this time, the VCRFGEN block 40 outputs the $V_{R16}$ reference voltage, on the VCRF line 45 at time $T_{SF}$. The CMP comparator 35 senses that the VMEM line 31 is lower than the VCRF line 45 and outputs a logic low on the VCMPO line 49. With the PHSSEL line 46 low, the GATEA switch 50 passes the low signal on the VCMPO line 49 to the STPDIR LATCH 52 and the latch 52 outputs a logic high on the STPDIR line 47. This is the end of the fringe detection subcycle. During the fringe detection subcycle, no latching pulse is generated on the LCHDAT line 70.

Next, at the beginning of the fringe restore subcycle, the PHSSEL line 46 is set high. With the STPDIR line 47 high and the PHSSEL line 46 high, per Table 1, the VCRFGEN block 40 outputs the voltage, $V_{R16}-V_{MRU15}$, on the VCRF line 45 at time $T_{SR}$. The CMP comparator 35 senses that the voltage on the VMEM line 31 is higher than on the VCRF line 45 and generates a logic high on the VCMPO line 49. Since the PHSSEL line 46 is high, the logic high on the VCMPO line 49 passes to the RES LATCH 53 through the GATEB switch 51. The logic high signal does not pass through the GATEA switch 50 to the STPDIR LATCH 52. Since the voltage is high at the input of the RES LATCH 53, the RES line 55 stays set high. With the condition STPDIR line 47=high and RES line 55=high, a restore low cycle condition is established and the FLGB line 65 is forced low. This ends the fringe restore subcycle and also ends the BSERD technique. If at the beginning of the fringe detection subcycle, the BSERD technique had detected neither (1111) nor (0000) on the DATABUS[0–3] bus 44, then the BSERD sensing technique would have ended.

At the conclusion of the BSERD technique, the binary data pattern for the N bits corresponding uniquely to the $V_T$ level stored in the selected cell 20 is latched in the DATA [0–3] LATCHES block 48 and is available for read out via the DATABUS[0–3] bus 44, the DATA, ADDR & CNTRL SYSTEM INTERFACE block 10, and the DATA bus 11.

In the preferred embodiment, there are two conditions, restore low and restore high, that can cause a restore cycle condition at the end of the restore detection or fringe restore subcycles. STPDIR line 47=high and RES line 55=high is the restore low condition which forces the FLGB line 65 low. STPDIR line 47=low and RES line 55=low is the restore high condition which forces the FUGB line 68 high (see FIG. 7 and FIG. 8). If any time during the operation of the BSERD technique, a restore cycle condition is established, then the PROGRAM ERASE READ RESTORE SEQUENCER block 26 detects the condition and the status of the FLGB line 65 and FUGB line 68 are internally saved on restore cycle status latches. The restore cycle status latches reside inside the PROGRAM ERASE READ RESTORE SEQUENCER block 26. If a restore cycle condition has been set during the operation of the BSERD technique, then upon its completion, the PROGRAM ERASE READ RESTORE SEQUENCER block 26 initiates an operation to save the address of the memory location requiring the restore cycle and also the type of restore cycle required, in the REGISTERS & ADDRESS BUFFER block 60.

Storage of the address requiring a restore cycle and also the type of restore required, allows the flexibility to perform the restore cycle at a later time. If the restore cycle operation is immediately performed on the current memory location, then the address and type of restore cycle required is not stored in the REGISTERS & ADDRESS BUFFER block 60. The REGISTERS & ADDRESS BUFFER block 60 can store the restore cycle information for a plurality of addresses which require a restore cycle operation. The REGISTERS & ADDRESS BUFFER block 60 can either reside in the same integrated circuit or in a separate system and may consist of either volatile or nonvolatile memory.

FIG. 6 and FIG. 7 show data sensing from one memory cell. The preferred embodiment also works for sensing data from a page of cells. A Y-DRIVER block 33 in FIG. 7 is repeated as many times as the number of cells, J, that exist in a page. The lines going across the boundary of the Y-DRIVER block 33 in FIG. 7 are common to all the Y-DRIVER blocks 33, except the lines to the CELL ARRAY block 21. The FLGB line 65 and FUGB line 68 are connected together in a wired-OR manner between all the Y-DRIVER blocks 33.

FIG. 11 shows a more detailed organization of the memory array and the Y-DRIVER blocks 33 for page mode operation, in one embodiment. The same organization is used during programming and restoring cycles operating on a page of cells and during erase cycles on an erase block of cells. There are "J" Y-DRIVER blocks 33 shown. The YDECO bus 34 from the Y-DEC block 18 in FIG. 7 controls the selection of the active page, through the Y-MUX 32 within each Y-DRIVER block 33.

The circuits and memory cell array shown in FIG. 11 within the outlined block labeled CELL ARRAY 21 are not part of this invention, but are described here to explain how the embodiment of this invention interfaces to an arbitrary memory cell array.

There are "S" pages shown in FIG. 11. There are also "K" blocks 83–84 shown. Each block may consist of a plurality of rows of cells. The block selection and the row selection are together performed by the BLOCK-DEC and the X-DEC blocks 19 and 17 respectively, as shown in FIG. 7. BSU sub-blocks 77 and BSL sub-blocks 78 within each block 83–84 perform selection or deselection of bit (sense) lines (BL00 line 71 through BLSJ line 72) or common lines (CL0 line 75 through CLK line 76) for each block 83–84 in the array. The BSU blocks 77 and BSL blocks 78 are controlled by SLUK lines 79 and SLLK lines 80. The SLL0 line 81, SLU0 line 82 and CL0 line 75 for the BLOCK0 block 83 and the SLLK line 80, SLUK line 79 and CLK line 76 for the BLOCKK block 84, as shown in FIG. 11 are generated by the BLOCK-DEC block 19 in FIG. 7.

Word lines (WL00 line 85 through WLKT line 86) select the appropriate row within all blocks 83–84. There are "T" wordlines per block shown in FIG. 11. The word lines are controlled by the X-DEC block 17 shown in FIG. 7. A plurality of X-DEC blocks 17, BLOCK-DEC blocks 19 and Y-DEC blocks 18 are used. For brevity, only one of each is shown in FIG. 7. In page operation, a block 83–84 is selected, a row is selected within that block, and a page is selected within that row. The heavily outlined cells 20 shown in FIG. 11, form page 1 in row 1 in block 0. This page 1 is selected through the bit (sense) BL10 line 73 through BL1J line 74, the word WL01 line 87 and the block select SLU0 line 82, SLL0 line 81, and CL0 line 75. An erase operation directly effects all the cells within a selected block 83. A program operation directly affects only the cells in a selected page. This embodiment of the invention can be interfaced to any nonvolatile memory cell array.

II. Mini-Programming

General Description of Mini-Programming Operations

A new multilevel programming technique called mini-programming is described in this section as part of the present invention. Unlike prior art programming techniques which start programming only into cells which are in a fully erased condition, the mini-programming technique operates without the need for a full erase and on cells which still contain valid data. In the prior art, the erase operation shifts the $V_T$ of all the cells in the selected erase block or sector all the way over to one end of the useable cell $V_T$ range, $V_F$, as shown in FIGS. 3A–3C, and labeled $V_{LERASE}$. After an erase operation, the prior art programming technique shifts the selected cells' $V_T$ out of the $V_{LERASE}$ range and into one of the other levels by moving a great deal of charge through the oxides surrounding the floating gate of the memory cell.

In contrast to the prior art, the mini-programming technique of the present invention moves only a small amount of charge without the need for a full erase. Each selected cell's $V_T$ is shifted only a small amount and only within the limits of that cell's original $V_L$ level. The deleterious effects on cell P/E cycling endurance caused by the prior art programming technique are avoided, since only a small amount of charge is moved by the new mini-programming technique. Also, only that amount of charge is moved as is necessary to correct the previously determined $V_T$ drift. The mini-programming technique takes less time than programming from the erase condition as is done by the prior art. Additionally, the mini-program affects the selected cell $V_T$ only slightly, so the resulting program disturb effect on other unselected cells is negligible. The mini-programming operation can shift the $V_T$ a small amount within a $V_L$ level in the opposite direction of erasure and thus performs one of the functions necessary for the desired $V_T$ restoration during a restore operation to enable reliable multilevel data storage.

The mini-programming technique utilizes the band sensing capabilities of the present invention, similar to those previously described in the multilevel digital sensing section, to read and verify that each cell's $V_T$ is stored in the desired band of the $V_L$ range. This ensures adequate margin guard bands to prevent ambiguous sensing at both ends of that $V_L$ range. This is accomplished by new multiple reference voltages during the mini-programming verify operations.

The mini-programming technique of this invention has two additional new reference voltages at $V_{RI}+V_{MPLI}$ and $V_{R(I+1)}-V_{MPUI}$. These reference voltages, in conjunction with $V_{RI}$ and $V_{R(I+1)}$, define two new lower and upper mini-programming margin guard bands, $V_{MPLI}$ and $V_{MPUI}$, within each of the $V_{LI}$ levels, as shown in FIG. 12. $V_{MPLI}$ and $V_{MPUI}$ may, or may not, be equal to, and may, or may not, be greater than the previously described $V_{MRLI}$ and $V_{MRUI}$ read margin guard bands. The $V_{MPLI}$ and $V_{MPUI}$ bands within each of the $V_{LI}$ levels are chosen such that the resulting $V_T$ distribution after mini-programming is optimized within a desired band which is narrower than the $V_L$ range. The optimization may require the $V_{MPLI}$ and $V_{MPUI}$ bands to be unequal to each other and may require different band values for each of the $V_{LI}$ levels and even arbitrary band values dictated by the memory cell array process technology. Alternatively, the $V_{MPLI}$ and $V_{MPUI}$ in each of the $V_{LI}$ levels may be of equal value. This invention can be adapted to accommodate the optimization for a wide variety of memory processing technologies.

The verify technique of this invention contrasts with previous techniques which verifies the cell $V_T$ only relative to a single value and relies on statistical process control to prevent the cell $V_T$ from overshooting the desired $V_T$ band. $V_T$ overshoot is a possibility during any programming operation and may occur due to the previously mentioned rogue cell effects. These effects are caused by charges trapped in the oxides surrounding the floating gate of the memory cell or other process-induced defects.

The mini-programming technique minimizes charge trapping and the possibility of creating a rogue cell by moving only small amounts of charge through the gate oxides. A mini-programming verify operation detects if the $V_T$ has been shifted too much into one of the guard bands so that a mini-erase operation (described below) is used to reestablish the desired $V_T$ within that level. This recovery capability for $V_T$ overshoot is not present in the prior art without first completing a full erase and reprogram operation. Using the restore method of this invention, full erasure and reprogramming is avoided during a $V_T$ overshoot recovery and the P/E endurance lifetime of the chip is preserved.

Mini-Programming Methodology

The mini-programming technique is best described by considering a plurality of cells which are connected in the same programming page. A practical multilevel memory system utilizes a page mode architecture to reduce programming time such that multiple cells are programmed simultaneously. It is necessary to comprehend the behavior of all the cells at least within such a page, if not the whole chip, to observe all the possible ramifications of any form of programming.

FIG. 12 shows the $V_T$ distribution of a plurality of cells in the memory which are within the same level, $V_{LI}$, at two different times, $T_{RESR}$ and $T_{RESP}$. In this example, one $V_T$ distribution shows the condition after the cells have been read using the previously described BSERD technique of this invention at time $T_{RESR}$. The BSERD technique has detected two cells with $V_T$ values at A and B within the $V_{MRLI}$ guard band. The restore conditional flags have been set to indicate that a restore operation is necessary. The BSERD technique has also determined that the restore operation may be accomplished without the need for a mini-erase since no cells were detected within the $V_{MRUI}$ guard band and a restore high condition flag remains set for this page address.

In one embodiment of the present invention, the chip conveniently executes a mini-programming operation at a later time to restore the $V_T$ of the page of cells which have previously been flagged for a restore operation without mini-erase. First, the cells are read by a simplified BSERD technique using only the data detection subcycle without the restore detection subcycle to latch the N binary bits corresponding to the $V_T$ which was stored in each read cell.

In an alternative embodiment of the present invention, if a mini-program operation is performed immediately after a regular full BSERD read, the first simplified BSERD step is omitted since the N binary bits have been already latched by the full BSERD technique. Next, the cells' $V_T$ are compared (verified) against a new lower mini-programming margin reference voltage, $V_{RI}+V_{MPLI}$, where I corresponds uniquely to the level represented by the latched N binary bits. This verify sensing differs from a read sensing during BSERD since the verify does not change the status of the previously latched N binary bits corresponding to the $V_T$ stored in the cell. Therefore, any cells now verified with $V_T$ below $V_{RI}+V_{MPLI}$ are within the lower mini-programming margin guard band, $V_{MPLI}$, defined by the values $V_{RI}$ and $V_{RI}+V_{MPLI}$.

Next, a mini-programming pulse of appropriate voltage and duration is selectively applied only to cells which were previously determined to have $V_T$ within the lower $V_{MPLI}$ guard band by the previous verify step, within the selected page. The cells with $V_T$ above the $V_{MPLI}$ guard band are excluded from the mini-programming pulse. After the first mini-programming pulse, another verify operation is executed. If any cells are verified within the lower $V_{MPLI}$ guard band, another mini-programming pulse is selectively applied, again, only to those cells within the $V_{MPLI}$ band. The verify/mini-programming pulse sequence is repeated until time $T_{RESP}$, shown in FIG. 12, when all the cells within the page are verified to have their $V_T$ above the $V_{MPLI}$ guard band, or until a predetermined maximum number of mini-programming pulses have been applied and a system error flag is set. The resulting cell $V_T$ distribution may now appear as shown in the second distribution shown in FIG. 12 at $T_{RESP}$.

In this example, the restore operation was originally triggered by the cells which were previously found to be within the lower read margin guard band, $V_{MRLI}$, such as cells A and B in FIG. 12. Cells with $V_T$ within $V_{MPLI}$ have also been mini-programmed, resulting in a tighter $V_T$ distribution for the entire page in addition to correcting the originally flagged cells within $V_{MRLI}$. The resulting tighter page-wide $V_T$ distribution improves system performance by eliminating the need for future restore operations on this page.

To detect a $V_T$ overshoot condition, an additional verify step is performed after the verify/mini-programming pulse sequence described above. Alternatively, the additional verify step can be done after each mini-programming pulse but would take longer to accomplish. This additional step verifies the $V_T$ of all the cells in the selected mini-programmed page against a second new mini-programming upper margin reference voltage, $V_{R(I+1)}-V_{MPUI}$, where I, again, corresponds uniquely to the same level represented by the latched N binary bits. Any cells now verified with their $V_T$ above the voltage $V_{R(I+1)}-V_{MPUI}$ are within the upper mini-programming margin guard band, $V_{MPUI}$, defined by the values $V_{R(I+1)}$ and $V_{R(I+1)}-V_{MPUI}$. A $V_T$ overshoot system conditional flag is set if any cell $V_T$ is detected within the $V_{MPUI}$ guard band. Later, a restore operation checks if the $V_T$ overshoot system conditional flag is set and determines if a $V_T$ overshoot recovery operation is necessary. The $V_T$ overshoot recovery is a sequence of operations including the mini-erase operation described in more detail below in the mini-erase section of this invention.

Multilevel Memory Mini-Programming System

FIG. 7 shows the block diagram of a preferred embodiment of the present invention and has already been described along with the BSERD sensing technique. The mini-programming verify sensing operations differ from the read sensing operation in that the PROGRAM ERASE READ RESTORE SEQUENCER block 26 instructs the ΔVU ΔVL GEN block 39 via the PRGRDB bus 37 to generate the $V_{MPUI}$ and $V_{MPLI}$ voltages, instead of the $V_{MRU(I-1)}$ and $V_{MRLI}$ voltages, from the reference voltage bus RVBUS 42. Also, the VX VY GEN block 38 is instructed to generate the $V_{RI}$ and $V_{R(I+1)}$ voltages, where I corresponds to the level represented by the N binary bits previously latched in the DATA[0–3] LATCHES block 48 within each Y-DRIVER 33 during the previous BSERD step.

After the verify operation sequence, the STPDIR LATCH 52 and RES LATCH 53 within each Y-DRIVER 33 are set such that the STPDIR line 47 is high if the cell $V_T$ verified within the $V_{MPLI}$ guard band. A high signal on the STPDIR line 47 turns on the high voltage HVSW switch 56 which passes the high voltage programming pulse from the PRGHV line 24 to the MLLINE line 30. The Y-MUX multiplexer 32 within each Y-DRIVER 33 passes the high voltage pulse to the appropriate cell 20 of the selected page in the CELL ARRAY 21 to be programmed as selected by the Y-DEC decoder 18. The STPDIR line 47 is low if the cell $V_T$ is verified outside the $V_{MPLI}$ guard band. A low signal on the STPDIR line 47 turns off the high voltage HVSW switch 56. This isolates the high voltage programming pulse from the MLLINE line 30.

If any cell $V_T$ is verified within the upper $V_{MPUI}$ guard band, the $V_T$ overshoot conditional flag is set within the PROGRAM ERASE READ RESTORE SEQUENCER block 26. The address location and corresponding $V_T$ overshoot conditional flag is stored in the REGISTERS & ADDRESS BUFFER block 60. Each time the verify/mini-programming pulse sequence is done, a counter is incremented in the PROGRAM ERASE READ RESTORE SEQUENCER block 26. If that counter exceeds a predetermined maximum number, the mini-programming for that page is stopped and a system error flag in the PROGRAM ERASE READ RESTORE SEQUENCER block 26 is set, along with the address, in the REGISTERS & ADDRESS BUFFER block 60.

III. Mini-Erasing

General Description of Mini-Erasing Operations

A multilevel erasing technique called mini-erasing is described in this section as part of the present invention. Unlike previous erasing techniques which destroy the data stored in the cells, the mini-erasing technique leaves intact the data originally stored in the cell. In the prior art, the erase operation shifts the $V_T$ of all the cells in the selected erase block all the way over to one end of the useable cell $V_T$ range, $V_F$, as shown in FIGS. 3A–3C, and labeled $V_{LERASE}$. This erasing shifts the selected cell's $V_T$ out of one of the other $V_L$ levels and into the $V_{LERASE}$ range by moving a great deal of charge through the oxides surrounding the floating gate of the memory cell.

In contrast, mini-erasing moves only a small amount of charge. As in the case of mini-programming, the cell's $V_T$ is shifted only a small amount and only within the limits of that cell's original $V_L$ level. The deleterious effects on P/E cycling endurance caused by the prior art erasing are avoided by mini-erasing. Only a small amount of charge is moved. Also, only that amount of charge necessary to correct the previously determined $V_T$ drift is moved. The mini-erasing operations require less time than erasing to the fully erased condition as is done by the prior art. Additionally, mini-erasing affects the selected cells' $V_T$ only slightly, and hence the resulting erase disturb effect on other unselected cells is negligible. The mini-erasing operation can shift the $V_T$ a small amount within a $V_L$ level in the opposite direction of programming and thus perform one of the functions necessary to do the desired $V_T$ restoration to enable reliable multilevel data storage.

The mini-erasing technique works together with the mini-programming technique previously described, to overcome a problem associated with large erase block size. A large number of cells which may be connected within the same erase block results in a wider distribution of cell $V_T$ after an erase pulse than the distribution obtained after a programming pulse is applied to a smaller number of cells within a programming page. The mini-erase technique uses a combination of mini-program and mini-erase operations to reduce the width of the cell $V_T$ distribution within each $V_{LI}$ level for all the cells within an erase block.

The mini-erase operation utilizes the band sensing capabilities of the present invention, similar to those described in the multilevel digital sensing section, to verify that each cell's $V_T$ is shifted into the desired band of the $V_L$ range ensuring adequate margin guard bands to prevent ambiguous sensing at both ends of that $V_L$ range. This is accomplished by multiple reference voltages during the mini-erasing verify. Three additional reference voltages at $V_{RI}+V_{MPELI}$, $V_{RI}+V_{MELI}$, and $V_{R(I+1)}-V_{MEUI}$, which in conjunction with $V_{RI}$ and $V_{R(I+1)}$, define three mini-erasing margin guard bands, $V_{MPELI}$, $V_{MELI}$, and $V_{MEUI}$, within each of the $V_{LI}$ levels as shown in FIGS. 13A and 13B. $V_{MPELI}$, $V_{MELI}$, and $V_{MEUI}$ may, or may not, be equal to and may, or may not, be greater than the previously described $V_{MRLI}$ and $V_{MRUI}$ read margin guard bands or $V_{MPLI}$ and $V_{MPUI}$ mini-programming margin guard bands. The $V_{MPELI}$, $V_{MELI}$, and $V_{MEUI}$ margin guard bands within each of the $V_{LI}$ levels are chosen such that the resulting $V_T$ distribution after mini-erasing is optimized within a desired band which is narrower than the $V_L$ range.

The optimization may require the $V_{MPELI}$, $V_{MELI}$, and $V_{MEUI}$ bands to be unequal to each other and may require different band values for each of the $V_{LI}$ levels or even arbitrary band values dictated by the memory cell array process technology. Alternatively, the margin guard bands in each level may be of equal value. Mini-erasing is flexible enough to accommodate the optimization for a wide variety of memory processing technologies.

The mini-erase verify technique of this invention contrasts to the prior art which verifies the cell $V_T$ only relative to a single voltage reference value and which relies on statistical process control to prevent the cell $V_T$ from undershooting the desired $V_T$ band. $V_T$ undershoot (the erase analogue of $V_T$ overshoot during programming) is a possibility during any erasing operation and may occur due to the previously mentioned rogue cell effects from trapped charges in the oxides surrounding the floating gate of the memory cell or other process induced defects. In addition, mini-erasing minimizes charge trapping and the possibility of creating a rogue cell by moving only small amounts of charge through the gate oxides.

The mini-erase verify operation detects if the $V_T$ of any of the cells in the erase block has been shifted into one of the $V_{MELI}$ guard bands and stops further mini-erasing so that the mini-programming technique can later reestablish the desired $V_T$ within that level. This recovery capability for $V_T$ undershoot is not present in the prior art without first completing a full erase and reprogramming operation. Using the restore operation of this invention, full erasure and reprogramming is avoided during a $V_T$ undershoot recovery and the P/E endurance lifetime of the chip is enhanced.

The direction of cell $V_T$ shift during erase is specific to a particular silicon technology. Mini-erasing accommodates either direction of erase $V_T$ shift and is applicable to a wide range of memory technologies. For simplicity, the mini-erasing operation is described with accompanying examples and figures to illustrate the case where the erase operation causes the cell $V_T$ to decrease. The opposite case of increasing $V_T$ with erase can be analogously handled by those skilled in the art. Thus the particular examples and methods should not be limited to a particular memory cell technology with respect to erase polarity.

Mini-Erasing Methodology

The mini-erasing technique is best described by considering a plurality of cells which are connected in the same erase block. A practical multilevel memory system should use an erase block memory cell architecture which reduces cell area so that many cells are erased simultaneously. It is necessary to comprehend the behavior of all the cells at least within such an erase block, if not the whole chip, to observe all the possible ramifications of any form of erasing.

FIGS. 13A and 13B show the $V_T$ distribution of a plurality of cells which are within the same level, $V_{LI}$, at six different times; $T_{RESR}$, $T_{RESPE1}$, $T_{RESE1}$, $T_{RESPE2}$, $T_{RESE2}$, and $T_{RESP}$. In this example, the $V_T$ distribution at time $T_{RESR}$ shows the condition of the cells after the cells have been read using the previously described BSERD technique. The BSERD technique detects two cells with $V_T$ values at A and B within the $V_{MRLI}$ guard band and two more cells with $V_T$ values at C and D within the $V_{MRUI}$ guard band. The restore conditional flags are set to indicate a restore operation is necessary. The BSERD technique has also determined that the restore operation may be accomplished with a mini-erase, since cells were detected within the $V_{MRUI}$ guard band and a restore low condition remains set for this block address.

In one embodiment of the mini-erase technique, the integrated circuit executes a series of operations including mini-program and mini-erase. The mini-program operations have been previously described. The mini-erase technique uses two versions of the mini-programming operation. One version is identical to the mini-programming described before. The previously described $V_{MPLI}$ and $V_{MPUI}$ margin guard bands help perform the final $V_T$ adjustment at the end of the mini-erase sequence.

The second version of mini-programming operation differs from the first version by the use of a different (pre-erase) programming guard band margin, $V_{MPELI}$. The mini-programming operation with $V_{MPELI}$ is executed before each mini-erase operation. Several mini-erase operations may be performed up to a predetermined maximum number of mini-erase operations. The sequence of operations in one embodiment of the mini-erase technique is described below.

In one embodiment, the integrated circuit conveniently executes a restore operation with mini-erase at some later time to restore the $V_T$ of the erase block of cells which have previously been flagged for restore with a mini-erase. All the cells within the erase block to be mini-erased are first mini-programmed such that the $V_T$ of all the cells within the erase block are above the $V_{MPELI}$ margin guard band for each of the I levels. This pre-erase mini-program is performed, in turn, for each page within the block using the mini-programming technique with the lower guard band verify value set to $V_{RI}+V_{MPELI}$, instead of $V_{RI}+V_{MPLI}$. The pre-erase mini-program is first completed for all the pages in the block at time $T_{RESPE1}$. An example of the resulting cell $V_T$ distribution within each $V_{LI}$ level and for all cells within the erase block appears at time $T_{RESPE1}$ in FIG. 13A. With the mini-program operation first, cells within the $V_{MPELI}$ band too close to a $V_R$ value, such as cells A and B at time $T_{RESR}$, might be shifted into the adjacent $V_L$ range during a mini-erase operation. This would result in data loss. The pre-erase mini-programming prevents data loss that might occur if a cell $V_T$ in the erase block is within the $V_{MPELI}$ band.

Next, a mini-erase pulse is applied to all the cells in the erase block. The mini-erase pulse shifts the $V_T$ of all the cells in the erase block towards the erase direction (the direction opposite to that of a programming operation). A mini-erase verify operation is next done for every cell in the erase block (consisting of multiple pages) so the first page in the erase block is selected for a mini-erase verify operation. The cells are next read by a simplified BSERD technique with only the data detection subcycle to latch the N binary bits corresponding to the $V_T$ stored in the cell. The cells' $V_T$ in the selected page of the erase block are then compared (verified) against a new lower mini-erasing margin reference voltage, $V_{RI}+V_{MELI}$, where I corresponds uniquely to the level represented by the latched N binary bits.

This verify sensing differs from a read sensing above since the verify operation does not change the status of the previously latched N binary bits corresponding to the $V_T$ stored in the cell. Cells now verified with $V_T$ below $V_{RI}+V_{MELI}$ lie within the lower mini-erasing guard band, $V_{MELI}$, defined by the values $V_{RI}$ and $V_{RI}+V_{MELI}$. If no cells are verified within the $V_{MELI}$ guard band of the first page, the next page is selected and similarly read and verified. If no cells are verified within the $V_{MELI}$ guard band in the whole erase block, another mini-erase pulse is applied to the erase block and the above read and verify operation is repeated.

The sequence of mini-erase pulse/erase block verify steps is terminated when any cell in any page of the selected erase block is found within the $V_{MELI}$ guard band during the erase block verification at time $T_{RESE1}$, or until a predetermined maximum number of mini-erase pulses has been done and a resulting error flag is set. An example of the cell $V_T$ distribution at time $T_{RESE1}$ is shown in FIG. 13A. This sequence of repeated mini-erase pulse/erase block verify operations is used to simultaneously adjust the $V_T$ of all the cells in the erase block in small increments and in such a manner to maintain the $V_T$ of all the cells within a narrower band than the original $V_{LI}$ range. Cell $V_T$ undershoot and data loss are thus prevented.

An alternative embodiment which is faster uses a single mini-erase pulse without the $V_{MELI}$ guard band verify operation. Tighter process control of the erase characteristics of all the cells in the erase block is relied upon to prevent data loss. Notice that FIG. 13A shows a long tail at the end of the cell $V_T$ distribution, on the erase direction side. This is due to some cells mini-erasing faster than others in the large population of cells in the erase block. The erase block's $V_T$ distribution has now been shifted in the erase direction as far as it can without $V_T$ undershoot and without any data loss. The cells (with $V_T$ at C and D in FIG. 13A) which originally triggered the mini-erase have now been shifted in the desired direction by an amount shown as $V_{DELE1}$ in FIG. 13A.

The next verify operation checks for any cells that exhibited $V_T$ overshoot behavior during the previous pre-erase mini-programming operation, such as cell E in FIG. 14A at time $T_{RESPE1}$, and checks if more mini-erasing is required. This mini-erase verify operation is again performed for every cell in the erase block so the first page in the erase block is selected for the mini-erase verify operation. The cells are next read by a simplified BSERD technique with only the data bit detection subcycle, i.e., without the restore detection subcycle, to latch the N binary bits corresponding to the $V_T$ stored in the cell. The cells' $V_T$ are then compared (verified) against a new upper mini-erasing margin reference voltage, $V_{R(I+1)}-V_{MEUI}$, where I corresponds uniquely to the level represented by the latched N binary bits.

This verify sensing operation again differs from a read sensing operation described above since the verify operation does not change the status of the previously latched N binary bits corresponding to the $V_T$ stored in the cell. Therefore, any cells now verified with $V_T$ above $V_{R(I+1)}-V_{MEUI}$ are within the upper mini-erasing guard band, $V_{MEUI}$ defined by the values $V_{R(I+1)}$ and $V_{R(I+1)}-V_{MEUI}$. If no cells are verified within the $V_{MEUI}$ guard band of the first page, the next page is selected and similarly read and verified. If any cells are verified within the $V_{MEUI}$ guard band in the whole erase block, the above sequence of pre-erase mini-programming/mini-erasing/verify operations is applied again to the erase block unless a predetermined maximum number of such sequences has been done and resulting error flag is set.

If any cells during the verify are detected within the $V_{MEUI}$ guard band, the address location of those cells are compared to the previously stored address locations of the cells which originally triggered the mini-erase, such as C and D in FIG. 13A. If a new address is detected, such as E in FIG. 14A, the $V_T$ overshoot conditional flag is set and the page address is stored. The example shown in FIGS. 13A and 13B requires two of the above sequences since the two cells at C and D were still within the $V_{MEUI}$ guard band at time $T_{RESE1}$. In this example, a second pre-erase mini-programming is completed at time $T_{RESPE2}$ followed by a second series of mini-erase pulses resulting in shifting the $V_T$ of cell C by the amount $V_{DELE2}$ at time $T_{RESE2}$. The resulting cell $V_T$ distribution is shown in FIG. 13B.

The final mini-programming operation begins after no cells are found within the $V_{MEUI}$ guard band during the above erase block verification at time $T_{RESE2}$ as shown in the example in FIG. 13B. The final mini-programming operation is performed in the same manner as described in the mini-programming section, except that each page within the erase block is mini-programmed in turn. During the final mini-programming operation, if any cell $V_T$ is detected within the upper $V_{MPUI}$ guard band, a $V_T$ overshoot system conditional flag is set and the page address is stored. The final mini-programming operation restores the entire erase block's cell $V_T$ distribution for each $V_L$ level between the $V_{MPLI}$ and $V_{MPUI}$ guard bands, as shown in the example in FIG. 13B at time $T_{RESP}$.

The $V_T$ overshoot system conditional flag is checked before any mini-programming operation is begun on any page. Whenever a page to be mini-programmed is encountered with this flag set, the mini-programming pulse sequence is altered to produce a smaller than normal incremental cell $V_T$ shift with each pulse, called micro-programming. The cell $V_T$ distribution within each level in the selected page after the verify/micro-programming pulse sequence is completed is tighter than after a verify/mini-programming pulse sequence. Micro-programming a flagged page takes a longer time than mini-programming but overall system performance is optimized, since only the requisite flagged pages are micro-programmed.

In an alternate micro-programming operation, the $V_{MPELI}$, $V_{MPLI}$, and $V_{MPUI}$ guard bands used during mini-programming are replaced with $V_{CPELI}$, $V_{CPLI}$, and $V_{CPUI}$ guard bands such that the resulting cell $V_T$ distribution within each $V_L$ range is optimized (see FIGS. 14A and 14B). As in the mini-programming technique, if the number of verify/micro-programming pulse sequences exceeds a predetermined number, the micro-programming is stopped and a system error flag is set. The $V_T$ overshoot system conditional flag is reset after the flagged page is successfully micro-programmed. Setting the $V_T$ overshoot system conditional flag during a restore without mini-erase simply starts the mini-erase operations for that erase block immediately or, alternatively, at a later convenient time. The mini-erase technique used in conjunction with micro-programming serve as the $V_T$ overshoot recovery method.

Multilevel Memory Mini-Erasing System

The PROGRAM ERASE READ RESTORE SEQUENCER block 26 together with the BINARY SEARCH READ SEQUENCER 43 of FIG. 7 perform all the necessary control and sequencing of events to perform the mini-erase operations. FIG. 11 shows a particular interface to the cell array 21.

For example, the BLOCK0 block 83 is selected for a mini-erase operation because a restore low condition was previously set for an address in this erase block. In FIG. 13A at time $T_{RESR}$, the PROGRAM ERASE READ RESTORE SEQUENCER 26 begins a mini-erase operation based on the restore conditional flags. As shown in FIG. 11, there are J cells per page, there are S pages per row, and there are T rows per block. Therefore, there are (S×T) pages per block and (S×T×J) cells per block. Using the FIG. 13A example, a pre-erase mini-program operation is first performed on all the pages of the BLOCK0 block 83. For each page of the BLOCK0 block 83, a simplified BSERD technique without the restore detection sub-cycle is first performed to simultaneously read the 4 bits of data from each cell 20 for all J cells in the selected page. After the read operation is complete, the DATA[0–3] LATCHES block 48 within each Y-DRIVER 33 contains the individual 4 bits per cell data for the respective J cells of the selected page.

Next, the PRGRDB bus 37 is set by the PROGRAM ERASE READ RESTORE SEQUENCER block 26. Based on the output from the DATA[0–3] LATCHES block 48 for each Y-DRIVER 33, the appropriate $V_{RI}$ voltage is generated as the VX output and the $V_{R(I+1)}$ voltage is generated as the VY output from the VX VY GEN block 38. The $\Delta$VU $\Delta$VL GEN block 39 generates $V_{MPELI}$ as $\Delta$VL output. The VCRFGEN block 40 generates the voltage ($V_{RI}+V_{MPELI}$) on the VCRF line 45 during all of the pre-erase mini-programming operations. A pre-erase mini-programming operation is now performed with a repeated sequence of mini-program pulsing and verify operations until all the J cells within the selected page have $V_T$ above the ($V_{RI}+V_{MPELI}$) voltage. The PROGRAM ERASE READ RESTORE SEQUENCER block 26 and the BINARY SEARCH READ SEQUENCER block 43 then continue pre-erase mini-programming of all the S pages in the first row $WL_{00}$ line 85. This continues until all T rows with S pages have been pre-erase mini-programmed with all the cell $V_T$'s programmed above the ($V_{RI}+V_{MPELI}$) voltage. This completes the pre-erase mini-programming of the selected BLOCK0 block 83. A typical distribution of the cell $V_T$ for the BLOCK0 is shown in FIG. 13A at time $T_{RESPE1}$.

The PRG-ERS bus 22 is forced to set the BLOCK-DEC block 19, the X-DEC block 17 and the Y-DEC block 18 to allow an erase operation on the selected memory block or sector. Next, a mini-erase pulse is applied to all the cells 20 in the selected BLOCK0 block 83. The mini-erase pulse is generated by the HVGEN block 27 and passed via the HVOUT bus 25.

After the application of the mini-erase pulse, a verify operation is performed on all the cells 20 in the selected BLOCK0 block 83. The BSERD technique without the restore detection sub-cycle latches the 4-bits of data from each cell 20 in a page in the DATA[0–3] LATCHES block 48 within each Y-DRIVER 33. Based on the output from the DATA[0–3] LATCHES block 48 within each Y-DRIVER 33, the VX VY GEN block 38 generates the $V_{RI}$ voltage as VX output and the $V_{R(I+1)}$ voltage as VY output. The $\Delta$VU $\Delta$VL GEN block 39 generates the $V_{MELI}$ voltage as $\Delta$VL output.

During all of the mini-erase verify operations, the VCRFGEN block 40 outputs the voltage ($V_{RI}+V_{MELI}$) on the VCRF line 45, which is uniquely defined by the output from the DATA[0–3] LATCHES block 48 for each Y-DRIVER 33. The PROGRAM ERASE READ RESTORE SEQUENCER block 26 and the BINARY SEARCH READ SEQUENCER block 43 then perform the mini-erase verification operations on all S pages of all T rows of the selected BLOCK0 block 83. The mini-erase verification compares the voltage on the VMEM line 31 with the voltage on the VCRF line, ($V_{RI}+V_{MELI}$), for each Y-DRIVER 33. If during the mini-erase verification operation the VMEM line 31 is lower than the VCRF line 45, a conditional flag is set in the PROGRAM ERASE READ RESTORE SEQUENCER block 26. If the conditional flag is not set, then another mini-erase pulse and mini-erase verification operation is performed on the selected BLOCK0 block 83. Whenever a conditional flag is set or the maximum count of mini-erase pulse operations is reached, the PROGRAM ERASE READ RESTORE SEQUENCER block 26 stops the mini-erase/verification operations. FIG. 13A shows at time $T_{RESE1}$, the distribution of the cell $V_T$ after a conditional flag has been set.

The overshoot cell verification operation is next performed on all the cells of the selected BLOCK0 block 83. The PROGRAM ERASE READ RESTORE SEQUENCER block 26 and the BINARY SEARCH READ SEQUENCER block 43 perform the over-shoot cell verification on all S pages of all T rows of the selected BLOCK0. During the entire overshoot verification operation, the voltage on the VCRF line 45 is set to $V_{R(I+1)}-V_{MEUI}$, which uniquely depends on the output of the DATA[0–3] LATCHES block 48 within each Y-DRIVER 33. For each page, and for each Y-DRIVER 33, the over-shoot verification continues to the next page if the VMEM line 31 is lower than the VCRF line 45. If any time for a selected page, the VMEM line 31 is higher than the VCRF line 45 for any Y-DRIVER 33, then the address of those cells 20 are stored in the REGISTERS & ADDRESS BUFFER block 60.

The addresses of the overshoot conditionally flagged cells are matched with the addresses of the cells which originally triggered the mini-erase conditional flag. If an address mismatch is found, then the overshoot conditional flag is set for that page along with the page address in the REGISTERS & ADDRESS BUFFER block 60. If the addresses match, another pre-erase mini-programming operation is performed. FIGS. 13A and 13B show the distribution of the cell $V_T$ at time $T_{RESPE2}$ after the second pre-erase mini-programming operation.

Then another mini-erase pulse is applied and mini-erase verification performed. FIG. 13B at time $T_{RESE2}$ shows the distribution of the cell $V_T$ after the second mini-erase/verification operation. If the overshoot conditional flag is not set after the $V_{MEUI}$ guard band verify, the final mini-programming operation of all the pages in the selected BLOCK0 block 83 is performed. At the beginning of the final mini-programming operation for each page, the PROGRAM ERASE READ RESTORE SEQUENCER block 26 performs a $V_T$ overshoot conditional flag check for that page in the REGISTERS & ADDRESS BUFFER block 60. If no flag is found, a regular mini-programming operation is performed. FIG. 13B at time $T_{RESP}$ shows the distribution of the cell $V_T$ after the final regular mini-programming operation is performed. Whenever a conditional flag is found for a page, a micro-programming operation is performed on the page. It is preferred that the micro-programming operation be identical to the mini-programming operation with the following exceptions; 1) the PROGRAM ERASE READ RESTORE SEQUENCER block 26 instructs the ΔVU ΔVL GEN block 39 via the PRGRDB bus 37 to generate the $V_{CPELI}$, $V_{CPUI}$ and $V_{CPLI}$ voltages, instead of the $V_{MPELI}$, $V_{MPUI}$ and $V_{MPLI}$ voltages from the analog voltage bus RVBUS 42, and 2) the PROGRAM ERASE READ RESTORE SEQUENCER block 26 instructs the HVGEN block 27 via the HVCTRL 23 bus to alter the mini-programming pulse to a micro-programming pulse so that the cells' 20 $V_T$ shifts less than during the mini-programming operation.

IV. Programming
General Description of Programming Operations

The described integrated circuit also operates with a novel multilevel programming technique. This programming technique differs from the previously described mini-programming technique. This programming stores new data into a previously erased page while mini-programming restores the existing data without altering the previously stored data. Compared to mini-programming, the programming technique moves greater amounts of charge through the oxides surrounding the floating gate and may shift the cell $V_T$ by a larger amount. Unlike previous programming techniques which only shifts the cell $V_T$ in one (programming) direction, the programming technique of the present invention shifts the cell $V_T$ in both programming and erase directions.

Such previous multilevel memory programming requires a very tight cell $V_T$ distribution. Very wide margins within each level after programming allow for future $V_T$ drift which will occur over the entire lifetime of the memory chip. FIG. 15A shows an example of the initially tight distribution of cell $V_T$ within a $V_L$ level immediately after prior art programming using a single margin value at $PV_I$ at time $T_P$. Also shown in the same figure is the distribution after a long period during which $V_T$ drift effects have substantially widened the initially tight distribution to the point of ambiguous sensing failure at time $T_F$.

In contrast, the present invention allows the use of a very wide cell $V_T$ distribution within each level resulting from the initial programming step to store the data reliably for a short time (see FIG. 15B at time $T_P$) until the memory can execute a restore operation at a near future time (as shown at $T_{RESP}$ in FIG. 15B). Additionally, the margins maintained and described by the cell $V_T$ restore techniques of this invention (see FIG. 15B at $T_F$) are not as wide as the margins required during programming without the use of this invention. The tight programming $V_T$ distribution required in the prior techniques greatly lengthens the programming time since many verify/program pulse sequences are needed to shift the $V_T$ in small increments before verifying successfully to the desired reference voltage. In most system applications, longer programming time is highly undesirable from the external system's point of view. On the other hand, the present invention reduces programming time for multilevel storage by enabling the external system's perceived programming algorithm to employ a wide cell $V_T$ distribution within each level.

One embodiment of this invention differs from the previous techniques by requiring the final operation that sets the cell $V_T$ for all $V_{LI}$ levels be a programming operation and not an erase operation as is used in the prior art for one of the levels at either end of the $V_F$ range.

This invention divides the programming cycle into two parts. The first part initially stores the data quickly into the cells with only small margins about the $V_R$ reference values for each level. The small margins are adequate to reliably store the data temporarily before the long term $V_T$ drift effects cause data loss. This first part optimizes the programming time to be as short as possible from the external system's point of view. The total programming time for the external system is only the time required to do the data storage during the first part. The first part performs most of the charge movement through the gate oxides and most of the cells' $V_T$ shift.

The second part is identical to the previously described restore with mini-erase operations. Since data has already been stored in the cells in the first part, the second part can be accomplished autonomously of the external system. The second part can be performed after the programming period perceived by the external system is over and during periods when the memory chip would otherwise be idle. The second part of the programming cycle establishes the wider margins about the $V_R$ values which are required for optimized system operation and long term reliability. This second part of the programming cycle takes longer than the first part.

In one embodiment of the present invention, the second part occurs immediately after the first. In another embodiment, the slower second part is postponed to a later time soon after the first part but in such a way that the programming time seen by the external system is greatly reduced.

The first part of the program operation utilizes the band sensing capabilities of the present invention, similar to those described in the multilevel digital sensing section. Each cell's $V_T$ is verified to have shifted into the desired band of the $V_L$ range to ensure adequate margin guard bands to prevent ambiguous sensing at both ends of that $V_L$ range. Multiple reference voltages are used during the programming verify operations. The first part of the program technique uses reference voltages at $V_{RI}+V_{PLI}$ and $V_{R(I+1)}-V_{PUI}$ which, in conjunction with $V_{RI}$ and $V_{R(I+1)}$, define two new lower and upper programming margin guard bands, $V_{PLI}$ and $V_{PUI}$, within each of the $V_{LI}$ levels as shown in FIG. 15B. $V_{PLI}$ and $V_{PUI}$ may, or may not, be equal to and may, or may not, be greater than the previously described $V_{MRLI}$ and $V_{MRUI}$ read, or $V_{MPLI}$ and $V_{MPUI}$ mini-programming, or $V_{MPELI}$, $V_{MELI}$ and $V_{MRUI}$ mini-erase, or $V_{CPELI}$, $V_{CPLI}$, and $V_{CPUI}$ micro-programming guard bands. The $V_{PLI}$ and $V_{PUI}$ guard bands within each of the $V_{LI}$ levels are selected such that the resulting $V_T$ distribution after the first part of programming is optimized within a desired band which is narrower than the $V_L$ range. The optimization may require the $V_{PLI}$ and $V_{PUI}$ bands to be unequal to each other and may require different band values for each of the I levels, or even arbitrary band values, dictated by the memory cell array process technology. Alternatively, the bands in each level may be of equal value. The programming technique is flexible enough to accommodate the optimization for a wide variety of memory processing technologies.

The verify technique of this invention contrasts with previous programming techniques which verifies the cell $V_T$ only relative to a single reference voltage per level. In the prior art, a cell may be programmed such that the $V_T$ is so close to a $V_{R(I+1)}$ reference value that the previously described ambiguous sensing problem is created. By verifying the programmed data is within an optimized band using two additional verify reference voltages per level, the present invention prevents the ambiguous data sensing problem which may occur with previous techniques.

Programming Methodology

First, the new data is latched into the page to be programmed and converted into one of the $2^N$ $V_L$ levels for each cell. In one embodiment of the present invention, the integrated circuit executes the first part of the programming sequence. The cells' $V_T$ are compared (verified) against a new lower programming margin reference voltage, $V_{RI}+V_{PLI}$, where I corresponds uniquely to the level represented by the latched N binary bits. This verify sensing technique differs from the read and verify sensing previously described and differs from the prior art in that the value of the $V_{PLI}$ guard band, defined by the values $V_{RI}$ and $V_{RI}+V_{PLI}$, is much smaller than any of the former could allow. This invention allows such a small $V_{PLI}$ programming margin guard band since: 1) the second part of the programming sequence increases the margin for long term $V_T$ stabilization and 2) the second part is performed soon after the first part is completed, before appreciable $V_T$ drift can occur. This verify sensing differs from the read sensing operations (see BSERD technique previously described) since the verify does not change the status of the previously latched N binary bits corresponding to the $V_T$ to be stored in the cell.

Next, a program pulse of appropriate voltage and duration is applied to only selected cells in the selected page. The programming pulses are selectively applied only to cells which were previously determined to have $V_T$ below the $V_{RI}+V_{PLI}$ voltage by the previous verify step. The cells with $V_T$ above the $V_{RI}+V_{PLI}$ voltage are excluded from programming. After the first programming pulse, another verify operation is executed. If any cells are verified below the $V_{RI}+V_{PLI}$ voltage, another programming pulse is selectively applied, again, only to those cells with $V_T$ below the $V_{RI}+V_{PLI}$ voltage.

The programming technique is best described by considering a plurality of cells which are connected in the same page. FIGS. 16A and 16B show the $V_T$ distribution of a plurality of cells in the memory which are within the same level, $V_{LI}$, at six different times; $T_P$, $T_{RESPE1}$, $T_{RESE1}$, $T_{RESPE2}$, $T_{RESE2}$, and $T_{RESP}$. The verify/programming pulse sequence is repeated until time $T_P$, shown in FIG. 16A, when all the cells within the page are verified to have their $V_T$ above the $V_{RI}+V_{PLI}$ voltage or until a predetermined maximum number of pulses have been applied and a system error flag is set.

Once the first page is successfully programmed, the next erased page to be programmed is selected and the procedure repeated through the last page. Pages to be programmed must reside in previously erased blocks or sectors. The address of each erase block upon which the first part programming operation was performed is stored so that the second part of the programming operation can be performed later. The conclusion of this first part programming procedure determines the programming time seen by the external system. Significant multilevel programming time reduction is achieved by this invention since the programming pulses used in this part of programming do not require a cell $V_T$ distribution within each $V_L$ level as tight as required in the prior art.

This invention adds an additional verify step after the verify/programming pulse sequence described above. Alternatively, the new verify step can be done after each programming pulse. Of course, this variation would take more time. The additional step verifies the $V_T$ of all the cells in the selected page just programmed against a second new programming margin reference voltage, $V_{R(I+1)}-V_{PUI}$, where I, again, corresponds uniquely to the same level represented by the latched N binary bits (see FIG. 16A). Any cells now verified with their $V_T$ above the voltage, $V_{R(I+1)}-V_{PUI}$, are over-programmed and a system error flag is set. The verify operation ensures the $V_T$ of the programmed cells that pass verification are set within a band which is narrower than the $V_L$ range and establishes both upper and lower programming margins, $V_{PLI}$ and $V_{PUI}$. The possibility of ambiguous sensing when a bit programs too close to the $V_{R(I+1)}$ voltage reference value is avoided. In contrast, prior art techniques established only a lower margin.

At a convenient time after the first part programming sequence described above, the integrated circuit performs restore with mini-erase operations sequentially on all the erase blocks which had been just programmed. The cell $V_T$ distributions shown in FIG. 13A at time $T_{RESR}$ before a restore with mini-erase and FIG. 16A at time $T_P$ are illustrative of the result of these operations.

Thus, the second part of the programming sequence is accomplished entirely by the previously described restore with mini-erase technique. FIGS. 16A and 16B show these steps and correspond to the same steps shown in FIGS. 13A and 13B for the restore with mini-erase operations after times $T_{RESPE1}$, $T_{RESE1}$, $T_{RESPE2}$, $T_{RESE2}$, and $T_{RESP}$. The full guard bands, $V_{MPLI}$ and $V_{MPUI}$, have been restored before the cell $V_T$ stored with minimized guard bands in the first part of programming has had time to drift. The resulting cell $V_T$ distribution may now appear as shown in the last distribution shown in FIG. 16B at time $T_{RESP}$.

Alternatively, the integrated circuit conveniently executes the second part of the programming operation (a restore with mini-erase) at a later time to restore the $V_T$ of the erase block of cells previously flagged for the second part programming operation.

In another variation, the second part programming on the previously first part programmed erase blocks is performed immediately following that first part programming step. In either case, the second part programming operation is performed autonomously since all the data is already stored in the memory cells. Thus, the autonomously performed second part programming sequence of this invention does not add to the programming time perceived by the external system.

Multilevel Memory Programming System

The preferred embodiment for programming has already been described along with the BSERD sensing technique, the mini-programming technique and the mini-erasing technique. First, data from an external source is loaded into the DATA[0–3] LATCHES block 48 within each Y-DRIVER 33 through the DATA, ADDR & CNTRL SYSTEM INTERFACE block 10 in FIG. 7. The address location for storing the data is also provided. Data is programmed into an already erased block. The first part of programming is very similar to the mini-programming technique previously described. This time the PROGRAM ERASE READ RESTORE SEQUENCER block 26 instructs the ΔVU ΔVL GEN block 39 via the PRGRDB bus 37 to generate the $V_{PUI}$ and $V_{PLI}$ reference voltages, instead of the $V_{MPUI}$ and $V_{MPLI}$ voltages from the reference voltage bus RVBUS 42. The VX VY GEN block 38 is instructed to generate the $V_{RI}$ and $V_{R(I+1)}$ reference voltages, where I corresponds to the level represented by the N binary bits previously loaded and latched in the DATA[0–3] LATCHES block 48 within each Y-DRIVER 33. The program/verify and overshoot verify operations are similar to those used in the previously described mini-programming technique. The second part of the programming technique is exactly the same as the mini-erasing technique described previously.

V. Erasing

General Description During Erasing Operations

The integrated circuit also operates with a multilevel erasing technique which is different from the mini-erasing technique described earlier. Erasing destroys the previously stored data in the erased block or sector, while mini-erasing restores the existing data without altering the previously stored data. Also, erasing moves greater amounts of charge through the oxides surrounding the floating gate and may shift the cell $V_T$ by a larger amount than that which occurs during mini-erasing.

Unlike previous erase techniques which only shift the cell $V_T$ in one (erasing) direction, the erasing technique of the present invention shifts the cell $V_T$ in both programming and erase directions. Prior art erasing for multilevel memory storage creates a very wide cell $V_T$ distribution for all the cells in the erase block. The wide erased cell $V_T$ distribution, $V_{LERASE}$, has been used in previous techniques for one of the $2^N V_L$ ranges for multilevel storage. However, the present erasing technique does not use the wide erased cell $V_T$ distribution as one of the $2^N V_L$ ranges. All the $V_L$ ranges are optimized such that the $V_{L0}$ range is similar in width to any of the other $V_L$ ranges even while simultaneously overlapping the $V_{LERASE}$ range.

FIGS. 17A–17C show examples of the long term data storage distributions of cell $V_T$ for all the cells within an erase block for four bit per cell multilevel storage. Also, FIGS. 17A–17C all share the same memory array processing technology and thus have exactly the same: 1) range of useful cell $V_T$ for programming and erasing, indicated as $V_F$, and 2) $V_{LERASE}$ range.

However, these drawings differ from each other in the type of erasing technique and resulting $V_R$ value, $V_L$ range, and $V_M$ range. FIG. 17A shows an example where the $V_{LERASE}$ range is used for the $V_{L0}$ level (between the $V_{R0}$ and $V_{R1}$ reference values) similar to the previously used techniques. Sixteen levels are shown in FIG. 17A. Each level is separated by $V_M$; fifteen levels are $V_L$ wide; one level is $V_{LERASE}$ wide; $V_{LERASE} \gg V_L$; and $V_F = V_{LERASE} + 15V_M + 15V_L$. FIG. 17B shows one embodiment of this invention which optimizes the utilization of the whole $V_F$ range by: 1) not using the $V_{LERASE}$ range for the $V_{L0}$ level, and instead, 2) spreading substantially equal $V_L$ ranges over the whole $V_F$ range. The sixteen $V_L$ levels shown in FIG. 17B are separated by $V_M$ and $V_F = 16V_L + 15V_M$. Since $V_F$ is equal, $V_L + V_M$ is larger (and thus easier to manufacture and control) for the example in FIG. 17B than in FIG. 17A. The embodiment shown in FIG. 17B is thus superior to the technique shown in FIG. 17A and enables high density multilevel data storage.

Another variation is shown in FIG. 17C. Unlike the $V_L$ levels in FIG. 17B, which are spread over the whole $V_F$ range, the $V_L$ levels in FIG. 17C do not overlap into the $V_{LERASE}$ range. This does not give the benefits of a wide $V_L + V_M$ voltage, but may be necessary for more reliable data sensing in some technologies. Additionally, as previously described in the mini-erasing section, the erase technique of the integrated circuit accommodates either direction of erase $V_T$ shift. This invention allows for a wide variety of memory array processes and sensing circuits for multilevel storage.

The erase operation utilizes band sensing capabilities, similar to those described in the multilevel digital sensing section, to verify that each cell's $V_T$ is shifted into the desired band of the $V_L$ range. This ensures adequate margin guard bands to prevent ambiguous sensing at both ends of that $V_L$ range.

Multiple reference voltages are used during the erase verify. Reference voltages at $V_{R0} + V_{MEFL}$ and $V_{R1} - V_{MEFU}$ which, in conjunction with $V_{R0}$ and $V_{R1}$, define two new lower and upper erasing margin guard bands, $V_{MEFL}$ and $V_{MEFU}$, within the $V_{L0}$ level, as shown in FIGS. 18A and 18B. Erase reference voltages at $V_{EA}$, $V_{EB}$ and programming reference voltages at $V_{PEB}$, $V_{PEF}$ are used. Other voltages might also be used, as explained below. $V_{MEFL}$ and $V_{MEFU}$ may, or may not, be equal to and may, or may not, be greater than the previously described $V_{MRLI}$ and $V_{MRUI}$ read, or $V_{MPLI}$ and $V_{MPUI}$ mini-programming, or $V_{MPELI}$, $V_{MELI}$ and $V_{MUI}$ mini-erase, or $V_{CPELI}$, $V_{CPLI}$, and $V_{CPUI}$ microprogramming, or $V_{PLI}$, $V_{PUI}$ programming guard bands.

The $V_{MEFL}$ and $V_{MEFU}$ margin guard bands within the $V_{L0}$ level are chosen so that the resulting $V_T$ distribution after the erasing technique is optimized within a desired band which is narrower than the $V_{L0}$ range. The optimization may require the $V_{MEFL}$ and $V_{MEFU}$ bands to be unequal to each other. Alternatively, the bands may be of equal value.

This technique is optimized to accommodate a wide variety of memory processing technologies. The verify technique contrasts with the prior art which verifies the cell $V_T$ only relative to a single erase reference voltage. In the previous techniques, a cell may be erased such that the $V_T$ is so close to a $V_{R0}$ or $V_{R1}$ reference value that the previously described ambiguous sensing problem is created. By verifying the erased data is within an optimized band using additional verify reference voltages, the present erase technique prevents the ambiguous data sensing problem.

Erasing Methodology

The erasing technique is best described by considering a plurality of cells which are connected in the same erase block. As stated previously, practical multilevel memory systems utilize an erase block memory cell architecture for erasing many cells simultaneously to reduce cell area. It is necessary to comprehend the behavior of all the cells at least within such an erase block, if not the whole chip, to observe all the ramifications of any form of erasing.

FIGS. 18A and 18B show the $V_T$ distribution of a plurality of cells in the memory which are within four levels, $V_{L0}$ through $V_{L3}$, at seven different times, $T_{PE}$, $T_{E1}$, $T_{EPE2}$, $T_{E2}$, $T_{EPEF}$, $T_{EF}$, and $T_P$. FIGS. 18A and 18B follow the example in FIG. 17B. In this example, the $V_{LERASE}$ range overlaps four $V_L$ ranges. However, this technique should not be considered limited to this particular example.

The $V_T$ distribution at time $T_{PE}$ shows the condition of the cells just prior to erasure. The erasure methodology is similar in many respects to the mini-erasing methodology and is described in less detail since many of the same principles are used. First, the chosen sector is given an erase pulse. All the cells in the sector are then verified by either one of two ways depending on the characteristics of the memory array processing. The first way verifies that all cells are below the $V_{EA}$ reference voltage, while the second way verifies that all the cells are above the $V_{R0} + V_{MEFL}$ margin reference voltage. Subsequent erase pulse/verify sequences are applied until either all cells verify below the $V_{EA}$ reference voltage, until the first cell is verified within the $V_{MEFL}$ margin guard band, or until a maximum number of sequences (error flag) is reached. The resulting cell $V_T$ distribution is shown at time $T_{E1}$ in FIG. 18A.

Next, a series of pre-erase mini-programming/mini-erase steps are performed which alternatively tighten up and shift the erased cell distribution towards the $V_{R0}+V_{MEFL}$ margin reference voltage. The number of such pre-erase mini-programming/mini-erase sequences is again dependent upon the process to construct the memory and is minimized by the appropriate choice of reference voltage values.

The example in FIGS. 18A and 18B shows two such pre-erase mini-programming/mini-erase sequences at times $T_{EPE2}/T_{E2}$ and $T_{EPEF}/T_{EF}$ respectively. In the example shown in FIG. 18A, the first pre-erase mini-programming reference voltage is set at $V_{PEB}$. Mini-programming pulse/verify at $V_{PEB}$ operations are applied until all cells verify above the $V_{PEB}$ reference voltage. The cell $V_T$ distribution resulting from this first pre-erase mini-programming step is shown at time $T_{EPE2}$. Next, mini-erase pulse/verify operations are applied until either all cells verify below the $V_{EB}$ reference voltage, until the first cell is verified within the $V_{MEFL}$ margin guard band, or until a maximum number of sequences (error flag) is reached. The $V_{EB}$ reference voltage is chosen optimally between the previous $V_{EA}$ and $V_{R0}+V_{MEFL}$ reference voltages. The resulting cell $V_T$ distribution is shown at time $T_{E2}$ in FIGS. 18A–18B.

The pre-erase mini-programming/mini-erase steps are repeated again. Next, the second pre-erase mini-programming reference voltage is set at $V_{PEF}$. The $V_{PEF}$ reference voltage is chosen optimally between the previous $V_{PEB}$ and $V_{R0}+V_{MEFL}$ reference voltages. Mini-programming pulse/verify at $V_{PEF}$ operations are applied until all cells verify above the $V_{PEF}$ reference voltage. The cell $V_T$ distribution resulting from this second pre-erase mini-programming step is shown at time $T_{EPEF}$. Next, mini-erase pulse/verify operations are applied until either all cells verify below the $V_{R1}-V_{MEFU}$ guard band reference voltage, until the first cell is verified within the $V_{MEFL}$ margin guard band, or until a maximum (error flag) is reached.

This time, instead of applying another mini-programming step, it has been predetermined to be the time to verify using the $V_{R1}-V_{MEFU}$ guard band reference voltage. If no cells are verified within the $V_{MEFU}$ guard band or if a maximum number of erase steps (error flag) have been performed, the erase operation is completed. Alternatively, additional pre-erase mini-programming/mini-erase sequences are performed up to a maximum (error flag) using the next $V_{PE}$ reference voltage only if cells were verified to be above the $V_{R1}-V_{MEFU}$ guard band reference voltage at the end of the previous mini-erase verify step. The next $V_{PE}$ reference voltage is chosen optimally between the previous $V_{PE}$ and $V_{R0}+V_{MEFL}$ reference voltages. The resulting cell $V_T$ distribution after the second mini-erase is shown at time $T_{EF}$ in FIG. 18B and shows all the cells verifying below the $V_{R1}-V_{MEFU}$ guard band reference voltage. The erasing operation is completed. The resulting cell $V_T$ distribution which is similar in width to that obtained by the first part programming technique previously described, is shown at time $T_{EF}$ in FIG. 18B. The erase block is now ready for programming the cells which are not to remain in the $V_{L0}$ level. The cell $V_T$ distribution after the first part programming technique previously described, is shown at time $T_P$ in FIG. 18B.

Multilevel Memory Erasing System

The erasing operations are nearly identical to those of the mini-erasing technique described previously. The exceptions are that the PROGRAM ERASE READ RESTORE SEQUENCER block 26 instructs the ΔVU ΔVL GEN block 39 via the PRGRDB bus 37 to generate the $V_{MEFU}$ and $V_{MEFL}$ reference voltages, instead of the $V_{MEUI}$ and $V_{MELI}$ voltages from the reference voltage bus RVBUS 42. The VX VY GEN 38 is instructed to generate the $V_{R0}$ and $V_{R1}$ reference voltages. The $V_{EA}$, $V_{PEB}$, $V_{EB}$, and $V_{PEF}$ reference voltages are generated in a similar fashion and referenced to the closest $V_{RI}$ depending on the optimization previously described. Also, as previously described in the mini-erasing section, the PRG-ERS bus 22 is forced to setup the BLOCK-DEC blocks 19, X-DEC blocks 17 and the Y-DEC blocks 18 to allow an erase operation to occur on the selected memory block or sector.

While the above is a complete description of the preferred embodiments of the present invention, various alternatives, modifications and equivalents may be used. It should be evident that the present invention is equally applicable by making appropriate modifications to the embodiment described above. The memory technologies that apply to this invention are many and are not limited to just the storage of electric charge. Other fundamental properties of nature are capable of being stored in an integrated circuit memory cell. For instance, ferroelectric polarization in a film over a semiconductor channel modulates the conductivity of the channel and forms the basis for ferroelectric memories. The amount of polarization can be controlled by the voltage applied to a conductor, the control gate, over the ferroelectric film such that different degrees of conductivity can be obtained. Reference voltages may be used to set the control gate voltage. The present invention can thus be applied to ferroelectric memories analogously to charge storage memories.

Therefore, the above description should not be taken as limiting the scope of invention which is defined by the metes and bounds of the appended claims.

What is claimed is:

1. A method of operating an integrated circuit having a plurality of memory cells, comprising:

programming charge in each memory cell in one of a plurality of discrete amounts, each discrete amount corresponding to information bits and having a first preselected range;

determining a difference in said memory cell charge from a second preselected range, said second preselected range being narrower than said first preselected range; and restoring said charge in said memory cell into said second preselected range so that said charge is stored in a narrower range than from said programming charge step.

2. The method of claim 1 further comprising performing said determining and restoring steps immediately after said programming step.

3. The method of claim 1 further comprising performing said determining and restoring steps a time interval after said programming step.

4. The method of claim 1 wherein said restoring step comprises incrementally adding charge to, or subtracting charge from, said memory cell to adjust said amount of charge.

5. The method of claim 1 further comprising sensing an amount of charge in each memory cell with respect to said first preselected range to determine said corresponding information bits for each memory cell.

6. The method of claim 5 wherein said second preselected range corresponds to a second set of reference values and said difference determining step further comprises:

iteratively comparing a value corresponding to said amount of charge against a sequence of said second reference values, a reference value in one comparing step dependent upon results of a previous comparing step.

7. The method of claim 5 wherein said first preselected range corresponds to a first set of reference values and said amount of charge in said memory cell is sensed with respect to said first reference values to determine said corresponding information bits for said memory cell.

8. The method of claim 7 wherein said sensing step comprises:

iteratively comparing a value corresponding to said amount of charge against a sequence of said first reference values, a reference value in one comparing step dependent upon results of a previous comparing step.

9. The method of claim 7 wherein said second preselected range corresponds to a second set of reference values and said difference determining step further comprises:

iteratively comparing a value corresponding to said amount of charge against a sequence of said second reference values, a reference value in one comparing step dependent upon results of a previous comparing step;

and wherein each of said iteratively comparing steps against said sequence of said second reference values follows one of said iteratively comparing steps against said sequence of said first reference values.

10. The method of claim 9 further comprising performing said determining and restoring steps immediately after said programming step.

11. The method of claim 9 further comprising performing said determining and restoring steps a time interval after said programming step.

12. The method of claim 9 wherein said restoring step comprises incrementally adding charge to or subtracting charge from said memory cell to adjust said amount of charge.

13. The method of claim 1 wherein said memory cells comprise nonvolatile memory cells.

14. The method of claim 1 further comprising:

removing correspondence between charge in said memory cell and previously corresponding information bits prior to said programming step.

15. The method of claim 14 wherein said correspondence removing step comprises placing a minimum or maximum amount of said plurality of discrete amounts of charge in said memory cell, said placed amount of charge having a range no greater than that of said other discrete amounts.

16. The method of claim 15 wherein said correspondence removing step includes moving charge into and out of said memory cell.

17. A method of operating an integrated circuit having a plurality of memory cells, comprising:

programming charge in each memory cell in one of a plurality of discrete amounts, each discrete amount corresponding to information bits and having a preselected range; and removing correspondence between charge in said memory cell and previously corresponding information bits prior to said programming step, including placing a minimum or maximum amount of said plurality of discrete amounts of charge in said memory cell, said placed amount of charge having a range no greater than that of said other discrete amounts.

18. The method of claim 17 wherein said correspondence removing step includes moving charge into and out of said memory cell.

19. An integrated circuit memory circuit system comprising:

an array of memory cells, each memory cell capable of storing one of $2^N$ discrete amounts of electric charge corresponding to N digital information bits, each amount in a preselected range;

a programming circuit coupled to said memory cell array, said programming circuit supplying signals to said memory cell array to move electric charge to and from said memory cells so that charge stored in said memory cells corresponds to said digital information bits;

a reference voltage circuit capable of generating a first and second set of reference voltages, each set of reference voltages corresponding to a preselected range of electric charge stored in one of said memory cells corresponding to digital information bits, said second set of reference voltages corresponding to a narrower range than said first set of reference voltages;

comparators coupled to said memory cell array and said reference voltage circuit; and control circuitry coupled to said memory cell array, said reference voltage circuit, said comparators and said programming circuit, said control circuitry connecting a plurality of memory cells in said memory cell array to said programming circuit and said comparators to program charge in each memory cell of said plurality of memory cells, said charge programmed in a preselected range corresponding to said first set of reference voltages, said control circuitry subsequently connecting said comparators to said memory cell array and said reference voltage circuit to sense said charge outside of a preselected range corresponding to said second set of reference voltages in each memory cell of said plurality, and engaging said programming circuit to restore said charge in said preselected range corresponding to said second set of reference voltages in said memory cell.

20. The integrated circuit memory system of claim 19 wherein said control circuitry simultaneously connects a selected plurality of memory cells in said memory cell array to said programming circuit and said comparators to program charge in each memory cell of said selected plurality of memory cells.

21. The integrated circuit memory system of claim 19 wherein said control circuitry connects said comparators to said memory cell array and said reference voltage circuit to sense charge outside of a preselected range corresponding to said second set of reference voltages in each memory cell of said plurality, and engages said programming circuit to restore charge immediately after connecting said plurality of memory cells to said programming circuit and said comparators to program charge.

22. The integrated circuit memory system of claim 19 wherein said control circuitry connects said comparators to said memory cell array and said reference voltage circuit to sense charge outside of a preselected range corresponding to said second set of reference voltages in each memory cell of said plurality, and engages said programming circuit to restore charge a time interval after connecting said plurality of memory cells to said programming circuit and said comparators to program charge.

23. The integrated circuit memory system of claim 19 wherein said programming circuit restores charge without first erasing substantially all charge from said memory cell.

24. The integrated circuit memory system of claim 19 wherein said comparators iteratively compare a voltage corresponding to said electric charge amount in a memory cell of said plurality with respect to said first set of reference voltages to determine said digital information bits in said memory cell, a reference voltage in one comparison dependent upon results of a previous comparison.

25. The integrated circuit memory system of claim 19 wherein said comparators iteratively compare a voltage corresponding to said amount of charge against a sequence of said second set of reference voltages, a reference voltage in one comparison dependent upon results of a previous comparison.

26. The integrated circuit memory system of claim 19 wherein said comparators iteratively compare said voltage corresponding to said amount of charge against a sequence of said first set of reference voltages to determine said digital information bits in said memory cell, a reference voltage in one comparison dependent upon results of a previous comparison.

27. The integrated circuit memory system of claim 25 wherein said comparators iteratively compare said voltage corresponding to said amount of charge against a sequence of said first set of reference voltages to determine said digital information bits in said memory cell, a reference voltage in one comparison dependent upon results of a previous comparison.

28. The integrated circuit memory system of claim 27 wherein said comparators compare said voltage corresponding to said amount of charge first against said sequence of said first set of reference voltages to determine said digital information bits in said memory cell and then against said sequence of said second set of reference voltages, a first set reference voltage in one comparison dependent upon results of a previous comparison of a first set reference voltage and a second set reference voltage in one comparison dependent upon results of a previous comparison of a second set reference voltage.

29. The integrated circuit memory system of claim 28 wherein said control circuitry connects said comparators to said memory cell array and said reference voltage circuit to sense charge outside a preselected range corresponding to said second set of reference voltages in each memory cell of said plurality, and engages said programming circuit to restore charge immediately after connecting said plurality of memory cells to said programming circuit and said comparators to program charge.

30. The integrated circuit memory system of claim 28 wherein said control circuitry connects said comparators to said memory cell array and said reference voltage circuit to sense charge outside a preselected range corresponding to said second set of reference voltages in each memory cell of said plurality, and engages said programming circuit to restore charge a time interval after connecting said plurality of memory cells to said programming circuit and said comparators to program charge in said memory cell.

31. The integrated circuit memory system of claim 28 wherein said programming circuit restores charge without first erasing substantially all charge from said memory cell.

32. The integrated circuit memory system of claim 19 wherein said memory cells comprise nonvolatile memory cells.

33. The integrated circuit memory system of claim 19 wherein said control circuitry engages said programming circuit to remove correspondence between charge in said memory cells and previously corresponding information bits prior to moving charge to said memory cells to create correspondence between charge stored in said memory cells and digital information bits.

34. The integrated circuit memory system of claim 33 wherein said control circuitry engages said programming circuit to store a minimum or maximum amount of said plurality of discrete amounts of charge in said memory cell, said placed amount of charge having a range no greater than that of said other discrete amounts.

35. The integrated circuit memory system of claim 34 wherein said control circuitry engages said programming circuit to move charge into and out of said memory cell.

36. An integrated circuit memory system comprising
a plurality of nonvolatile memory cells;
a high voltage generation circuit;
a programming circuit coupled to said memory cells and said high voltage generation circuit and operable to connect said memory cells to said high voltage generation circuit so that each memory cell is programmed in one of a plurality of discrete amounts of charge, each discrete amount corresponding to N information bits and having a preselected range, and so that correspondence between charge amounts in said memory cells and previously corresponding information bits are removed prior to programming said memory cells, said programming circuit connecting said memory cells to said high voltage generation circuit to remove correspondence between charge amounts in said memory cells and previously corresponding information bits by programming said memory cells with a minimum or maximum amount of said plurality of discrete amounts of charge in said memory cell, said placed amount of charge having a range no greater than that of said other discrete amounts.

37. The integrated circuit memory system of claim 36 further comprising
a reference voltage circuit capable of generating a set of reference voltages, said set of reference voltages corresponding to said preselected range of electric charge amounts stored in said memory cells;
comparators coupled to said memory cell array and said reference voltage circuit;
and control circuitry coupled to said memory cells, said reference voltage circuit, said comparators and said programming circuit, said control circuitry connecting said memory cells to said programming circuit and said comparators to program said minimum or maximum amount of charge corresponding to a subset of said set of reference voltages.

38. The integrated circuit memory system of claim 37 wherein said comparators compare a voltage responsive to a charge amount in a memory cell with respect to said subset of said first set of reference voltages to determine whether said charge amount is a minimum or maximum of said discrete amounts.

* * * * *